US010256247B1

(12) United States Patent
Kanakamedala et al.

(10) Patent No.: US 10,256,247 B1
(45) Date of Patent: Apr. 9, 2019

(54) THREE-DIMENSIONAL MEMORY DEVICE WITH SILICIDED WORD LINES, AIR GAP LAYERS AND DISCRETE CHARGE STORAGE ELEMENTS, AND METHOD OF MAKING THEREOF

(71) Applicant: SANDISK TECHNOLOGIES LLC, Plano, TX (US)

(72) Inventors: Senaka Kanakamedala, San Jose, CA (US); Raghuveer S. Makala, Campbell, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/892,228

(22) Filed: Feb. 8, 2018

(51) Int. Cl.
*H01L 29/76* (2006.01)
*H01L 27/11556* (2017.01)
(Continued)

(52) U.S. Cl.
CPC .. *H01L 27/11556* (2013.01); *H01L 21/28097* (2013.01); *H01L 21/31111* (2013.01);
(Continued)

(58) Field of Classification Search
CPC ........... H01L 27/11524; H01L 27/1157; H01L 27/11568; H01L 27/11529
See application file for complete search history.

(56) References Cited

U.S. PATENT DOCUMENTS 5,915,167 A 6/1999 Leedy
5,933,734 A 8/1999 Ferla et al.
(Continued)

FOREIGN PATENT DOCUMENTS

WO WO2002/015277 A2 2/2002
WO WO2011/104782 A1 9/2011

OTHER PUBLICATIONS

F. Fracassi et al., J. Electrochem. Soc., vol. 143, No. 2, Feb. 1996, p. 701.
(Continued)

*Primary Examiner* — Hsien Ming Lee
(74) *Attorney, Agent, or Firm* — The Marbury Law Group PLLC

(57) ABSTRACT

A vertically alternating sequence of silicon-containing semiconductor layers and sacrificial material layers is formed over a substrate. Memory stack structures are formed through the vertically alternating sequence. After formation of backside trenches, backside recesses are formed by removing the sacrificial material layers employing an isotropic etchant introduced through the backside trenches. Composite electrically conductive layers are formed by reacting a metal layer with surface portions of silicon-containing semiconductor layers. A dielectric material can be anisotropically deposited to form a continuous material portion that includes vertically-extending dielectric material portions formed in the backside trenches and cavity-containing layers formed in the backside recesses. The composite electrically conductive layers include word lines, which are vertically spaced by cavity-containing layers. Each memory film can include a charge storage layer that is divided into a plurality of discrete charge storage material portions.

10 Claims, 24 Drawing Sheets

(51) Int. Cl.

| | |
|---|---|
| *H01L 27/11582* | (2017.01) |
| *H01L 27/11524* | (2017.01) |
| *H01L 27/1157* | (2017.01) |
| *H01L 23/535* | (2006.01) |
| *H01L 21/764* | (2006.01) |
| *H01L 21/28* | (2006.01) |
| *H01L 21/3213* | (2006.01) |
| *H01L 21/311* | (2006.01) |
| *H01L 21/768* | (2006.01) |
| *H01L 29/06* | (2006.01) |
| *H01L 29/423* | (2006.01) |

(52) U.S. Cl.
CPC ...... *H01L 21/32133* (2013.01); *H01L 21/764* (2013.01); *H01L 21/76877* (2013.01); *H01L 23/535* (2013.01); *H01L 27/1157* (2013.01); *H01L 27/11524* (2013.01); *H01L 27/11582* (2013.01); *H01L 29/0649* (2013.01); *H01L 29/42372* (2013.01)

(56) References Cited

U.S. PATENT DOCUMENTS

| | | | |
|---|---|---|---|
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,349,681 B2 | 1/2013 | Alsmeier et al. | |
| 8,445,347 B2 | 5/2013 | Alsmeier | |
| 8,658,499 B2 | 2/2014 | Makala et al. | |
| 8,847,302 B2 | 9/2014 | Alsmeier et al. | |
| 9,252,151 B2 | 2/2016 | Chien et al. | |
| 9,356,031 B2 | 5/2016 | Lee et al. | |
| 9,397,093 B2 | 7/2016 | Makala et al. | |
| 9,419,012 B1 | 8/2016 | Shimabukuro et al. | |
| 9,449,982 B2 | 9/2016 | Lu et al. | |
| 9,449,984 B2 | 9/2016 | Alsmeier et al. | |
| 9,576,975 B2 | 2/2017 | Zhang et al. | |
| 9,627,399 B2 | 4/2017 | Kanakamedala et al. | |
| 9,646,975 B2 | 5/2017 | Peri et al. | |
| 9,691,884 B2 | 6/2017 | Makala et al. | |
| 9,842,907 B2 | 12/2017 | Makala et al. | |
| 9,870,945 B2 * | 1/2018 | Pachamuthu | H01L 27/11582 |
| 9,875,929 B1 | 1/2018 | Shukla et al. | |
| 2007/0210338 A1 | 9/2007 | Orlowski | |
| 2007/0252201 A1 | 11/2007 | Kito et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0001252 A1 | 1/2012 | Alsmeier et al. | |
| 2012/0012920 A1 | 1/2012 | Shin et al. | |
| 2013/0083597 A1 | 4/2013 | Nakamura et al. | |
| 2013/0130495 A1 | 5/2013 | Higashitani et al. | |
| 2013/0264631 A1 | 10/2013 | Alsmeier et al. | |
| 2017/0243879 A1 | 8/2017 | Yu et al. | |
| 2018/0033646 A1 | 2/2018 | Sharangpani et al. | |

OTHER PUBLICATIONS

Younghee Lee, Jaime W. DuMont, and Steven M. George *Chem. Mater.*, 2016, 28 (9), pp. 2994-3003 (Publication Date (Web) Apr. 11, 2016), Trimethylaluminum as the Metal Precursor for the Atomic Layer Etching of $Al_2O_3$ Using Sequential, Self-Limiting Thermal Reactions.

Steven M. George and Younghee Lee, *ACS Nano*, 2016, 10 (5), pp. 4889-4894 (Publication Date (Web): May 24, 2016), Prospects for Thermal Atomic Layer Etching Using Sequential, Self-Limiting Fluorination and Ligand-Exchange Reactions.

U.S. Appl. No. 15/834,261, filed Dec. 7, 2017, SanDisk Technologies LLC.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report and Written Opinion, International Application No. PCT/US2013/035567, dated Sep. 30, 2013, 6pgs.

\* cited by examiner

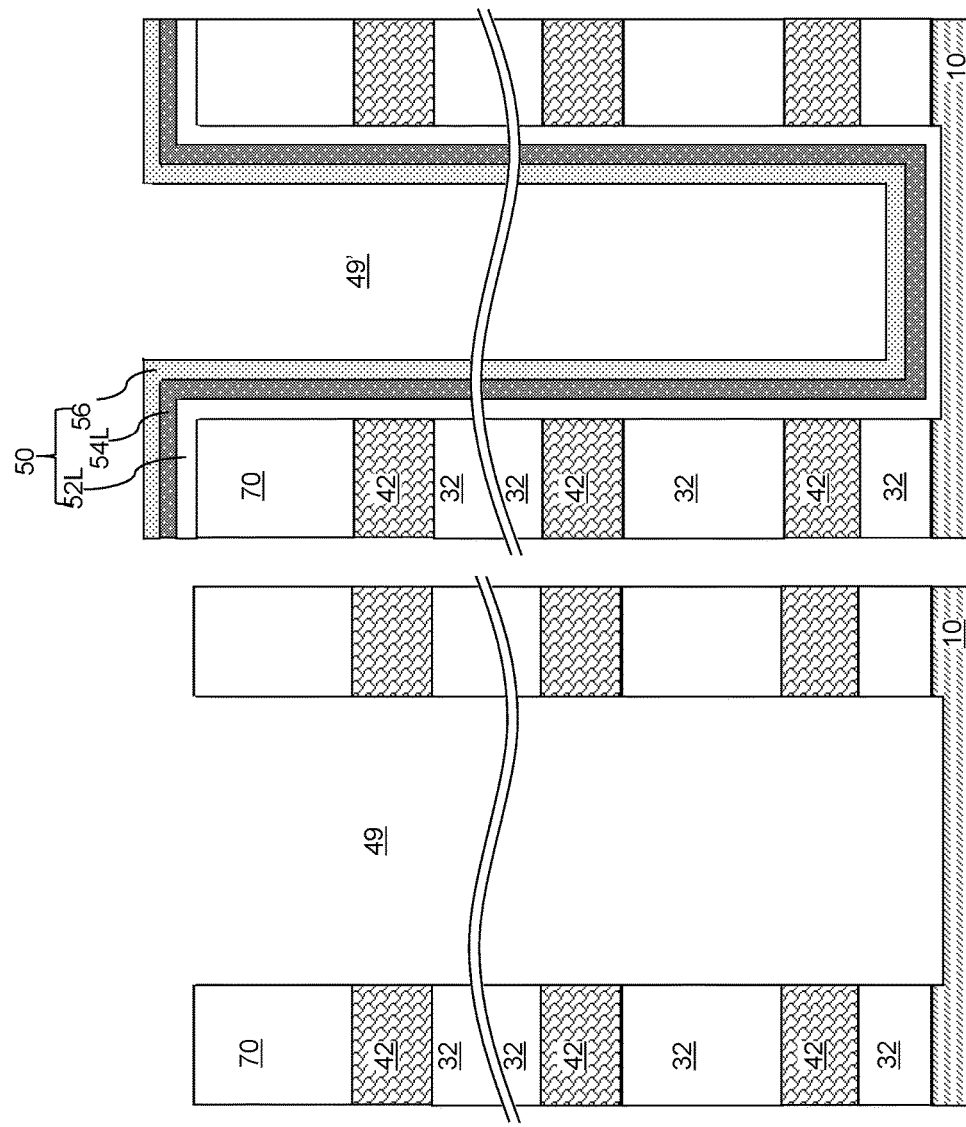

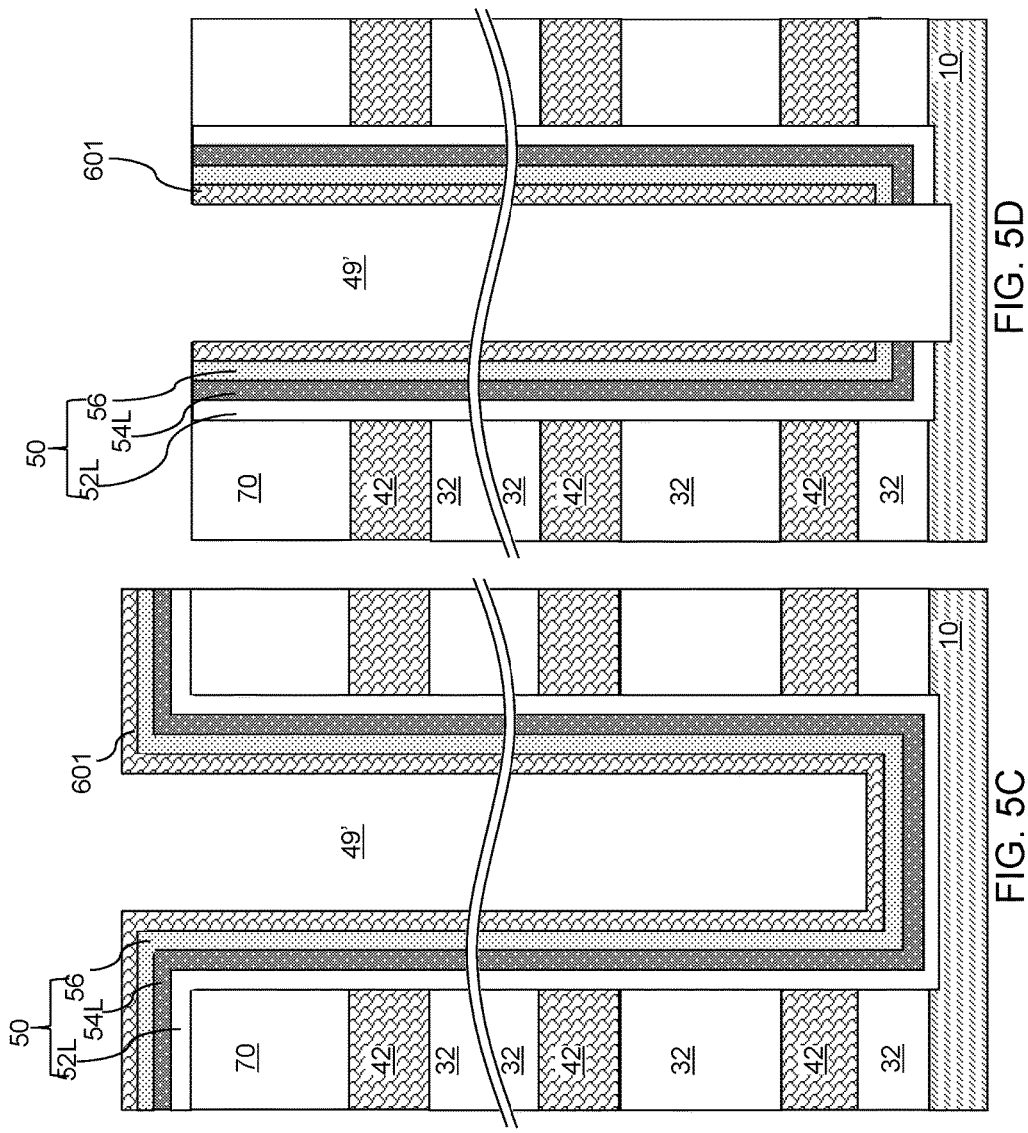

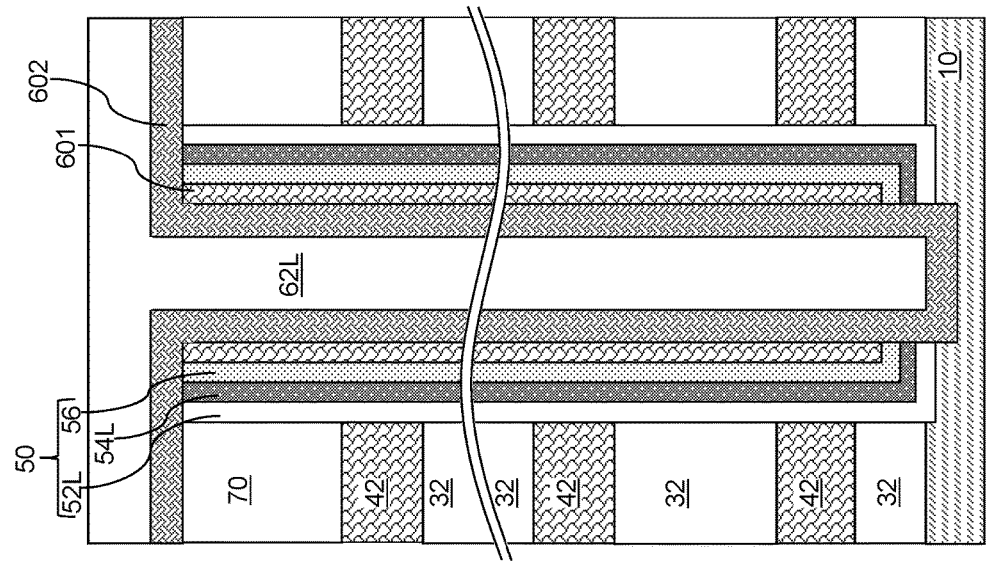
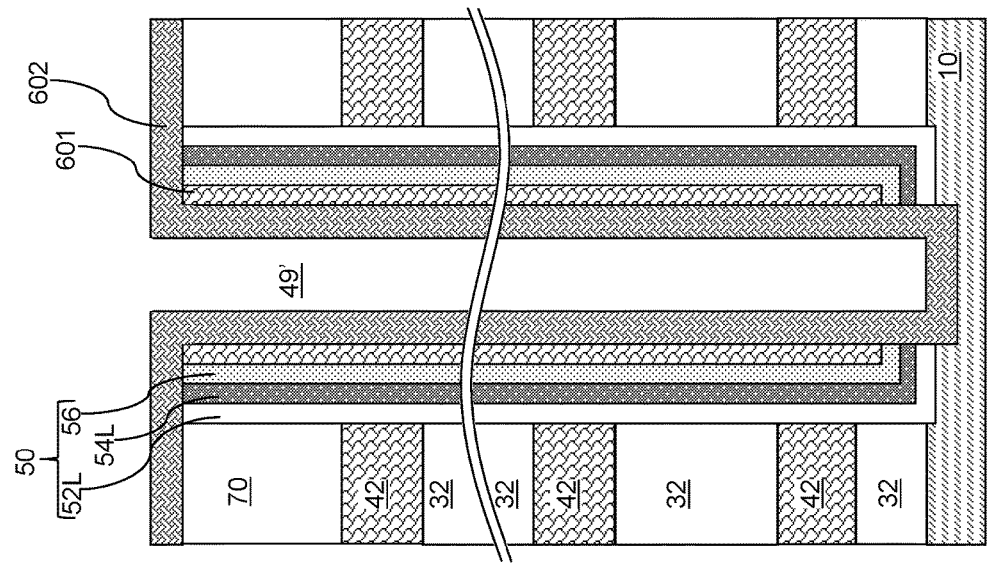

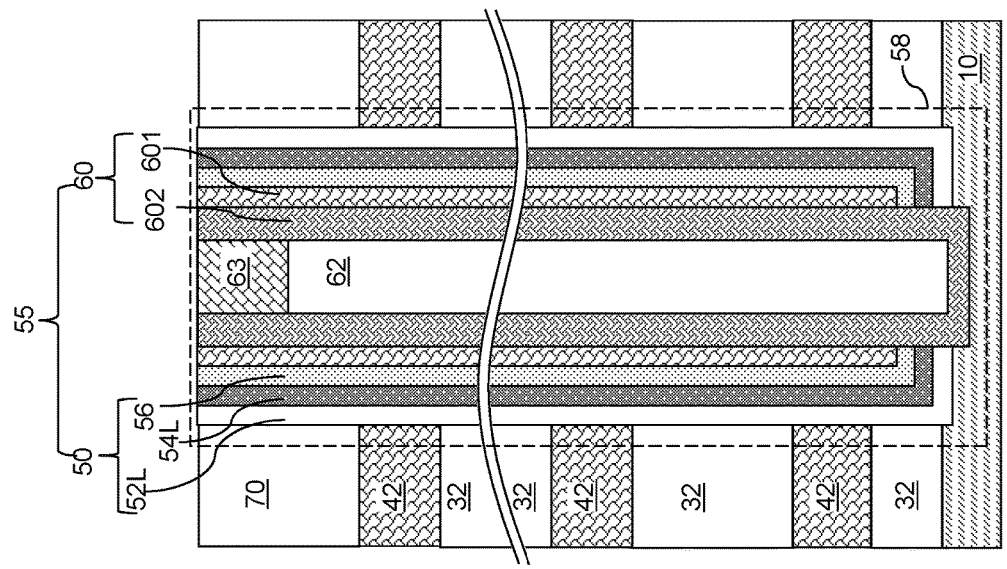
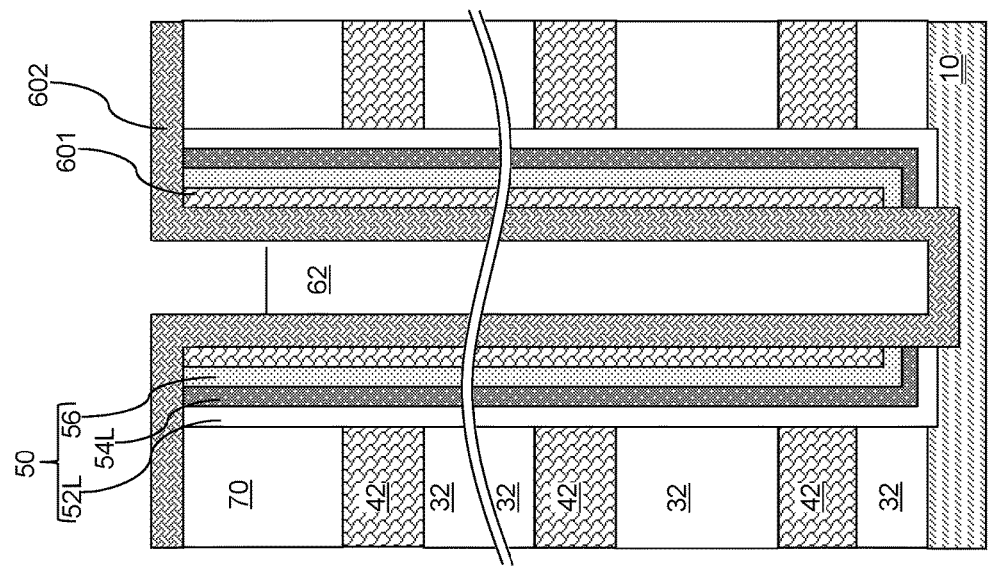

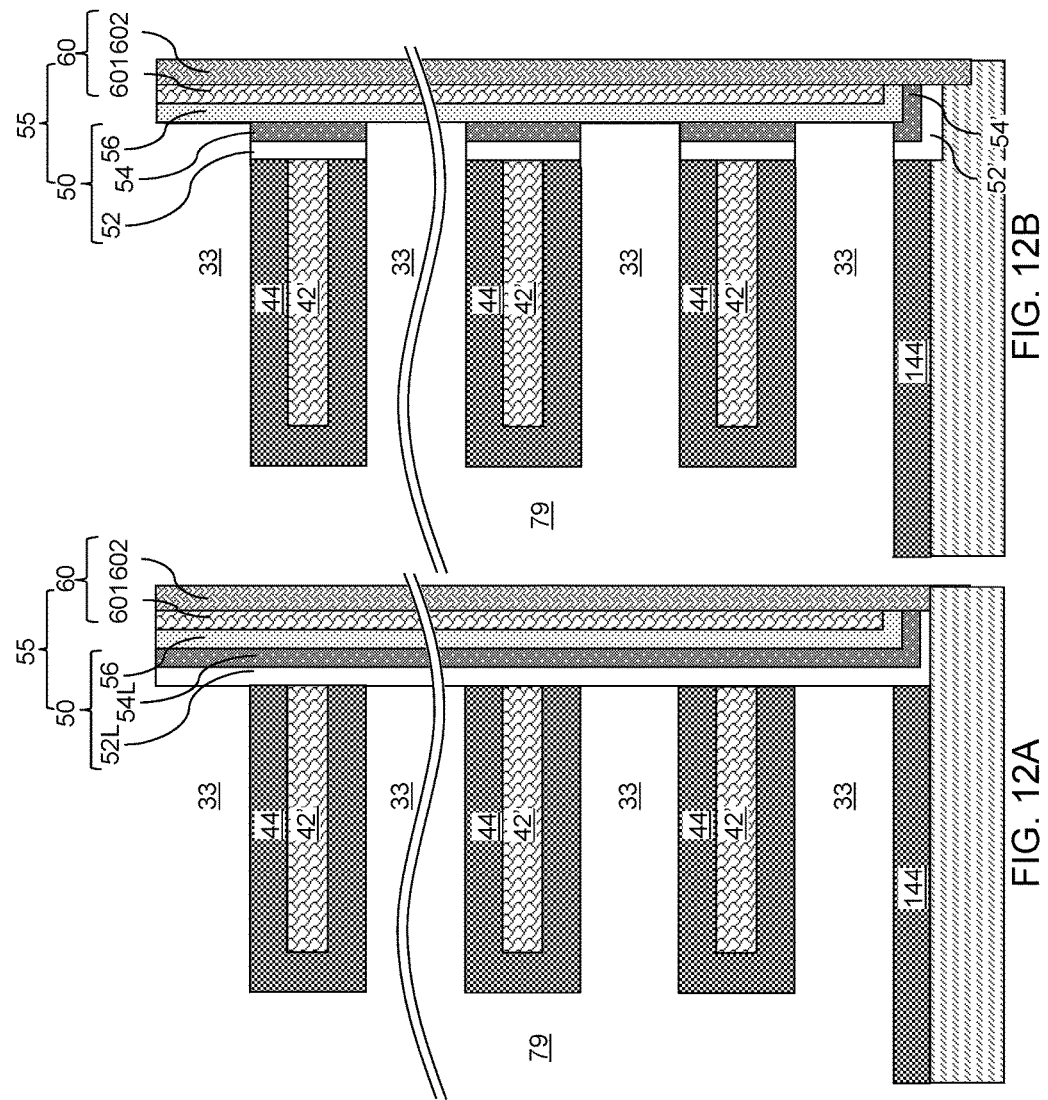

THREE-DIMENSIONAL MEMORY DEVICE WITH SILICIDED WORD LINES, AIR GAP LAYERS AND DISCRETE CHARGE STORAGE ELEMENTS, AND METHOD OF MAKING THEREOF

FIELD

The present disclosure relates generally to the field of semiconductor devices, and particular to a three-dimensional memory device including silicided word lines, air gap layers, and discrete charge storage elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of cavity-containing layers and composite electrically conductive layers located over a substrate, wherein each of the composite electrically conductive layers comprises a silicon-containing semiconductor core layer and a metal silicide shell layer contacting a top surface, a bottom surface, and a sidewall of the silicon-containing semiconductor core layer; memory stack structures extending through the alternating stack, wherein each of the memory stack structures comprises a memory film and a vertical semiconductor channel contacting an inner sidewall of the memory film; and contact via structures contacting a top surface of a respective one of the composite electrically conductive layers.

According to another aspect of the present disclosure, a method of forming a three-dimensional memory device is provided, which comprises: forming a vertically alternating sequence of silicon-containing semiconductor layers including a silicon-containing semiconductor material and sacrificial material layers over a substrate; forming memory stack structures extending through the vertically alternating sequence, wherein each of the memory stack structures comprises a memory film and a vertical semiconductor channel contacting an inner sidewall of the memory film; forming backside trenches through the vertically alternating sequence; forming backside recesses by removing the sacrificial material layers selective to the silicon-containing semiconductor layers employing an isotropic etchant introduced through the backside trenches; depositing a metal layer including a metal on remaining portions of the silicon-containing semiconductor material; forming composite electrically conductive layers by reacting the metal layer with surface portions of the remaining portions of the silicon-containing semiconductor material; and anisotropically depositing a dielectric material to form a continuous material portion that includes vertically-extending dielectric material portions formed in the backside trenches and cavity-containing layers formed in the backside recesses and adjoined to the vertically-extending dielectric material portions.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 12A-12D are sequential vertical cross-sectional views of a region of the exemplary structure during isolation of charge storage layers into a plurality of discrete charge storage material portions and formation of vertically-extending dielectric material portions and cavity-containing layers formed in the backside recesses by anisotropic deposition of a dielectric material according to an embodiment of the present disclosure.

DETAILED DESCRIPTION

Figure 1:
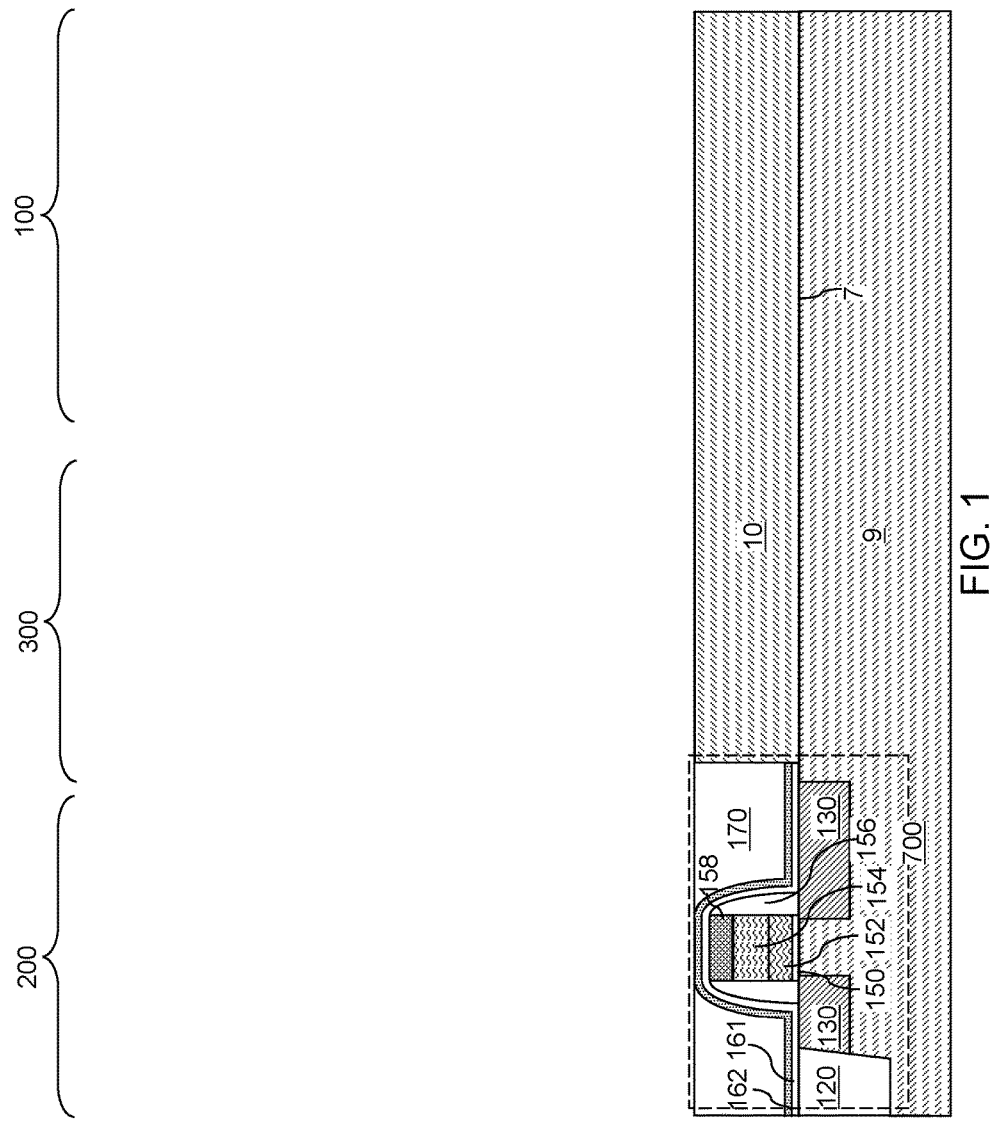
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device including silicided word lines, air gap layers, and discrete charge storage elements and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein.

A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

FIG. 1 is a schematic vertical cross-sectional view of an exemplary structure after formation of at least one peripheral device and a semiconductor material layer according to an embodiment of the present disclosure.

Figure 2:
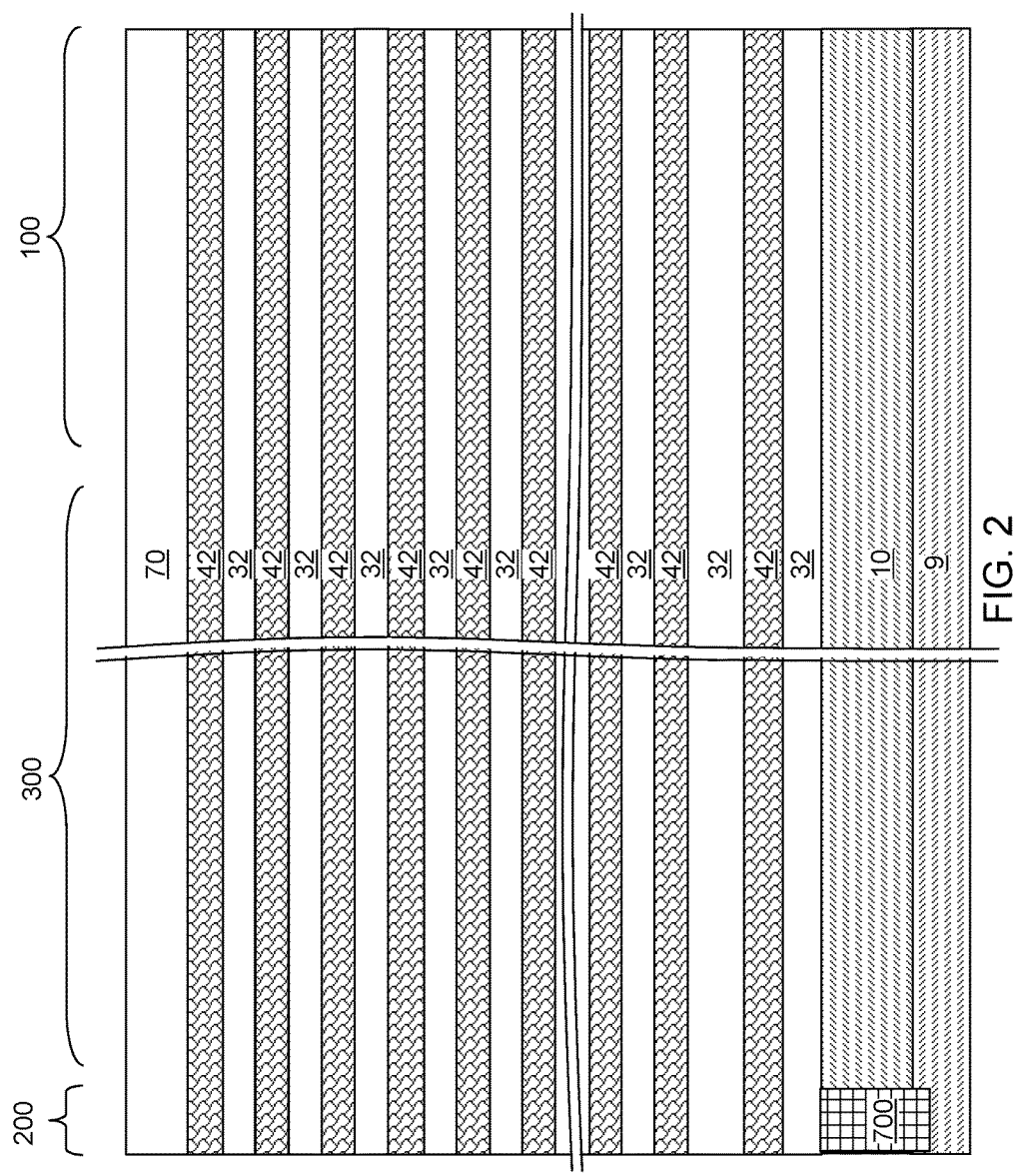
FIG. 2 is a schematic vertical cross-sectional view of the exemplary structure after formation of a vertically alternating sequence of silicon-containing semiconductor layers and sacrificial material layers according to an embodiment of the present disclosure.

Referring to FIG. 2, a vertically alternating sequence of silicon-containing semiconductor layers 42 and sacrificial material layers 32 is formed over the top surface of the substrate (9, 10). As used herein, a "material layer" refers to a layer including a material throughout the entirety thereof. As used herein, an "alternating sequence" of first elements and second elements refers to a structure in which instances of the first elements and instances of the second elements alternate. A "vertically alternating sequence" is an alternating sequence in which first elements and second elements alternate in a vertical direction. As used herein, an "alternating stack" or an "alternating plurality" of first elements and second elements refer to a stack structure including an alternating sequence of the first elements and the second elements. Within an alternating stack, each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The vertically alternating sequence of silicon-containing semiconductor layers 42 and sacrificial material layers 32 constitutes a prototype stack of alternating layers that are subsequently modified. As used herein, a "prototype" structure or an "in-process" structure refers to a transient structure that is subsequently modified in the shape or composition of at least one component therein.

Each silicon-containing semiconductor layer 42 includes a silicon-containing semiconductor material. As used herein, an element is "silicon-containing" if the element contains silicon above a trace level. In one embodiment, the atomic percentage of silicon atoms in the silicon-containing semiconductor layers 42 can be greater than 25%, greater than 50%, and/or greater than 75%. In one embodiment, the silicon-containing semiconductor layers 42 can include electrical dopants such as boron atoms, phosphorus atoms, arsenic atoms, and/or antimony atoms. The silicon-containing semiconductor layers 42 may optionally include at least another semiconductor material such as germanium and/or a III-V compound semiconductor material. In one embodiment, the atomic percentage of silicon in the silicon-containing semiconductor layers 42 can be greater than 50%, and may be greater than 75%, 90%, 95%, and/or 98%.

The silicon-containing semiconductor layers 42 can be amorphous or polycrystalline as initially deposited. In one embodiment, the silicon-containing semiconductor layers 42 can be heavily in-situ doped. Each silicon-containing semiconductor layer 42 can be deposited by chemical vapor deposition. For example, plasma enhanced chemical vapor deposition processes can be employed to deposit the silicon-containing semiconductor layers 42. The thickness of each silicon-containing semiconductor layer 42 can be in a range from 15 nm to 60 nm, such as from 20 nm to 40 nm, although lesser and greater thicknesses can also be employed.

Each sacrificial material layer 32 includes a sacrificial material that can be removed selective to the material of the silicon-containing semiconductor layers 42. As used herein, a "sacrificial" material refers to a material that is removed during a subsequent processing step. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

Sacrificial materials that can be employed for the sacrificial material layers 32 include, but are not limited to, silicon oxide (including doped or undoped silicate glass), silicon nitride, silicon oxynitride, organosilicate glass (OSG) and porous variants thereof, spin-on dielectric materials, and organic or inorganic polymer materials that can be dissolved in a solvent without etching the material of the silicon-containing semiconductor layers 42 significantly. In one embodiment, the sacrificial material layers 32 can include borosilicate glass (BSG) or a porous organosilicate glass (OSG).

Each sacrificial material layer 32 can be deposited by chemical vapor deposition. For example, plasma enhanced chemical vapor deposition processes can be employed to deposit the sacrificial material layers 32. The thickness of each sacrificial material layer 32 can be in a range from 15 nm to 60 nm, such as from 20 nm to 40 nm, although lesser and greater thicknesses can also be employed.

In one embodiment, the vertically alternating sequence of silicon-containing semiconductor layers 42 and sacrificial material layers 32 can begin at the bottom with a bottommost one of the sacrificial material layers 32 that is deposited directly on a top surface of the semiconductor material layer 10. In one embodiment, the vertically alternating sequence of silicon-containing semiconductor layers 42 and sacrificial material layers 32 can terminate at the top with a topmost one of the sacrificial material layers 32 or with a topmost one of the silicon-containing semiconductor layers 42. Alternatively, a sacrificial cap layer 70 including a same material as the sacrificial material layers 32 and having a greater thickness than any of the sacrificial material layers 32 may be formed in lieu of a topmost sacrificial material layer 32.

The number of repetitions of the pairs of a sacrificial material layer 32 and a silicon-containing semiconductor layer 42 can be in a range from 2 to 1,024, and typically from 8 to 256, although a greater number of repetitions can also be employed. The vertically alternating sequence of silicon-containing semiconductor layers 42 and sacrificial material layers 32 constitutes an alternating stack (32, 42), in which the silicon-containing semiconductor layers 42 and sacrificial material layers 32 alternate in the vertical direction. In one embodiment, each silicon-containing semiconductor layer 42 and each sacrificial material layer 32 in the alternating stack (32, 42) can have a respective uniform thickness that is substantially invariant with translation along any horizontal direction.

Figure 3A:
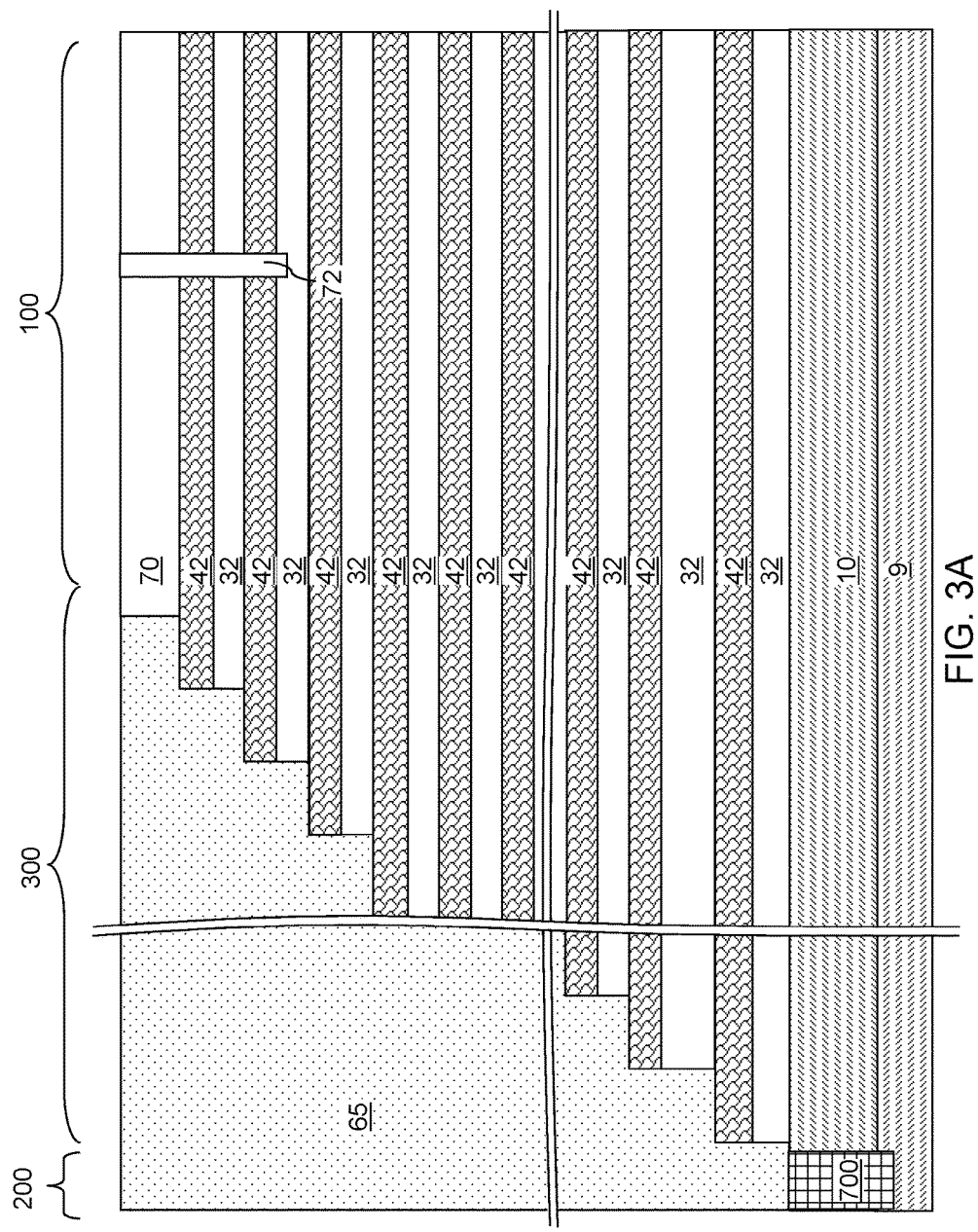
FIG. 3A is a schematic vertical cross-sectional view of the exemplary structure after formation of stepped terraces, a retro-stepped dielectric material portion, and drain select level isolation structures according to an embodiment of the present disclosure.
Figure 3B:
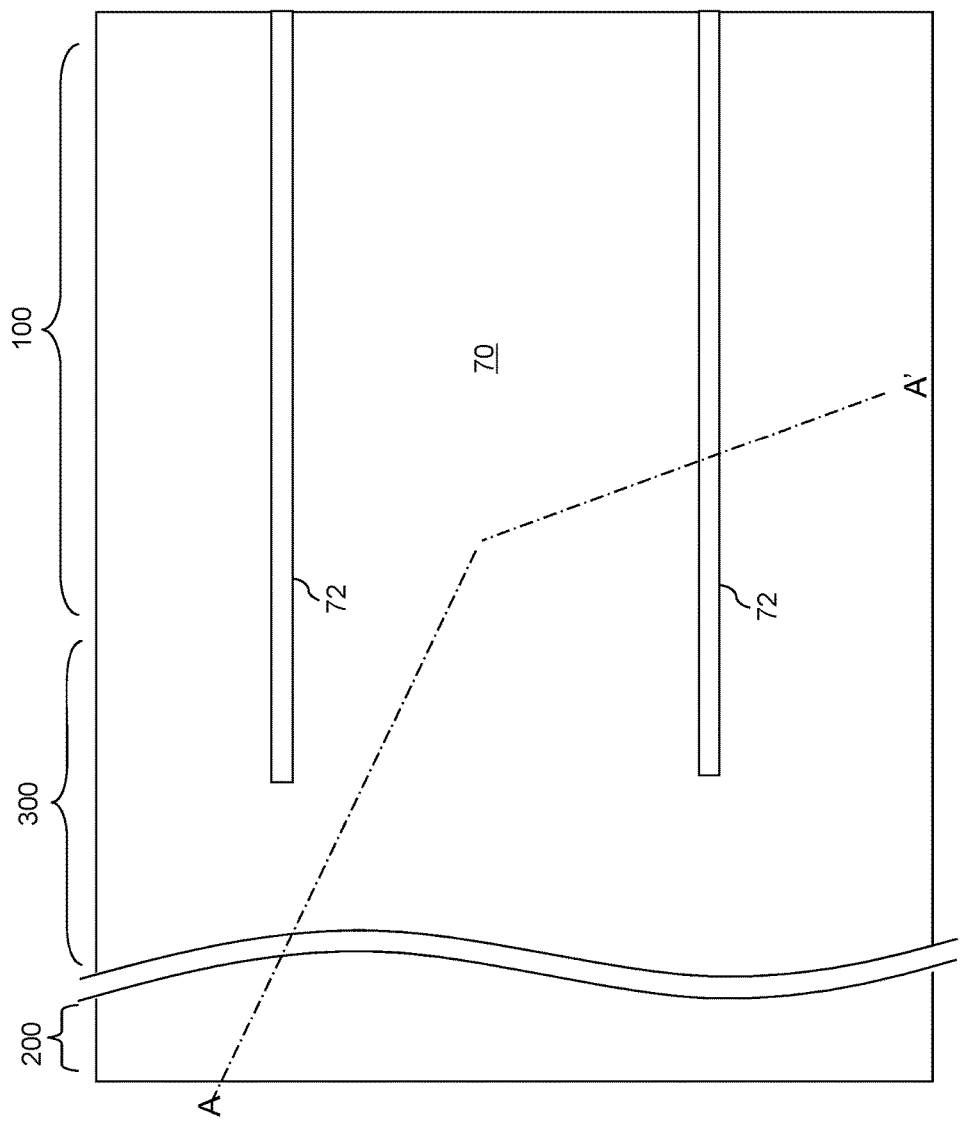
FIG. 3B is a top-down view of the exemplary structure of FIG. 3A. The vertical plane A-A' is the plane of the cross-section for FIG. 3A.

Referring to FIGS. 3A and 3B, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

The alternating stack (32, 42), i.e., the vertically alternating sequence, can be patterned to form a terrace region. Each sacrificial material layer 32 other than a topmost sacrificial material layer 32 within the alternating stack (32, 42) laterally extends farther than an overlying sacrificial material layer 32 within the alternating stack (32, 42). Each silicon-containing semiconductor layer 42 other than a topmost silicon-containing semiconductor layer 42 within the alternating stack (32, 42) laterally extends farther than any overlying silicon-containing semiconductor layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the sacrificial cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. In one embodiment, the retro-stepped dielectric material portion 65 can include, and/or consist essentially of, undoped silicate glass (USG). The retro-stepped dielectric material portion 65 overlies the vertically alternating sequence, i.e., the alternating stack (32, 42), in the terrace region. In one embodiment, top surfaces of the silicon-containing semiconductor layers 42 and sidewalls of the sacrificial material layers 32 contact the retro-stepped dielectric material portion 65.

Optionally, drain select level isolation structures 72 can be formed through the sacrificial cap layer 70 and a subset of the silicon-containing semiconductor layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the sacrificial cap layer 70.

In one embodiment, each drain-select-level isolation structure 72 can vertically extend at least through a topmost sacrificial material layer 32 among the sacrificial material layers 32 within the vertically alternating sequence of the silicon-containing semiconductor layers 42 and the sacrificial material layers 32. Each drain-select-level isolation structure 72 can include, or can consist essentially of, a material having an etch rate in an isotropic etchant that is less than 10% of an etch rate of a material of the sacrificial material layers 32. For example, the drain-select-level isolation structures 72 can include undoped silicate glass and the sacrificial material layers 32 can include borosilicate glass or porous or non-porous organosilicate glass such that an isotropic etchant of dilute hydrofluoric acid can provide an etch selectivity greater than 10, such as an etch selectivity greater than 100, for the material of the sacrificial material layers 32 with respect to the material of the silicon-containing semiconductor layers 42.

Figure 4A:
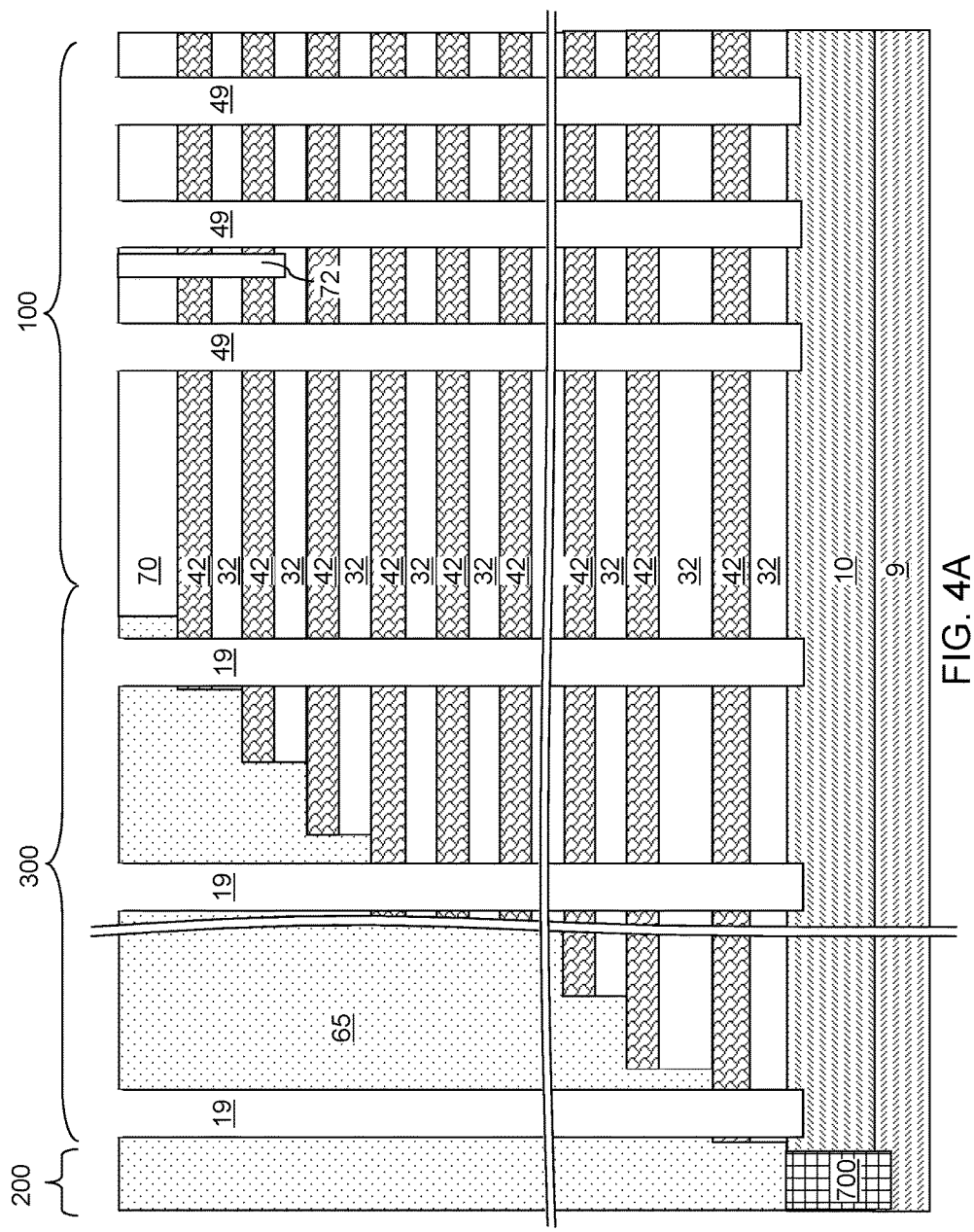
FIG. 4A is a schematic vertical cross-sectional view of the exemplary structure after formation of memory openings and support openings according to an embodiment of the present disclosure.
Figure 4B:
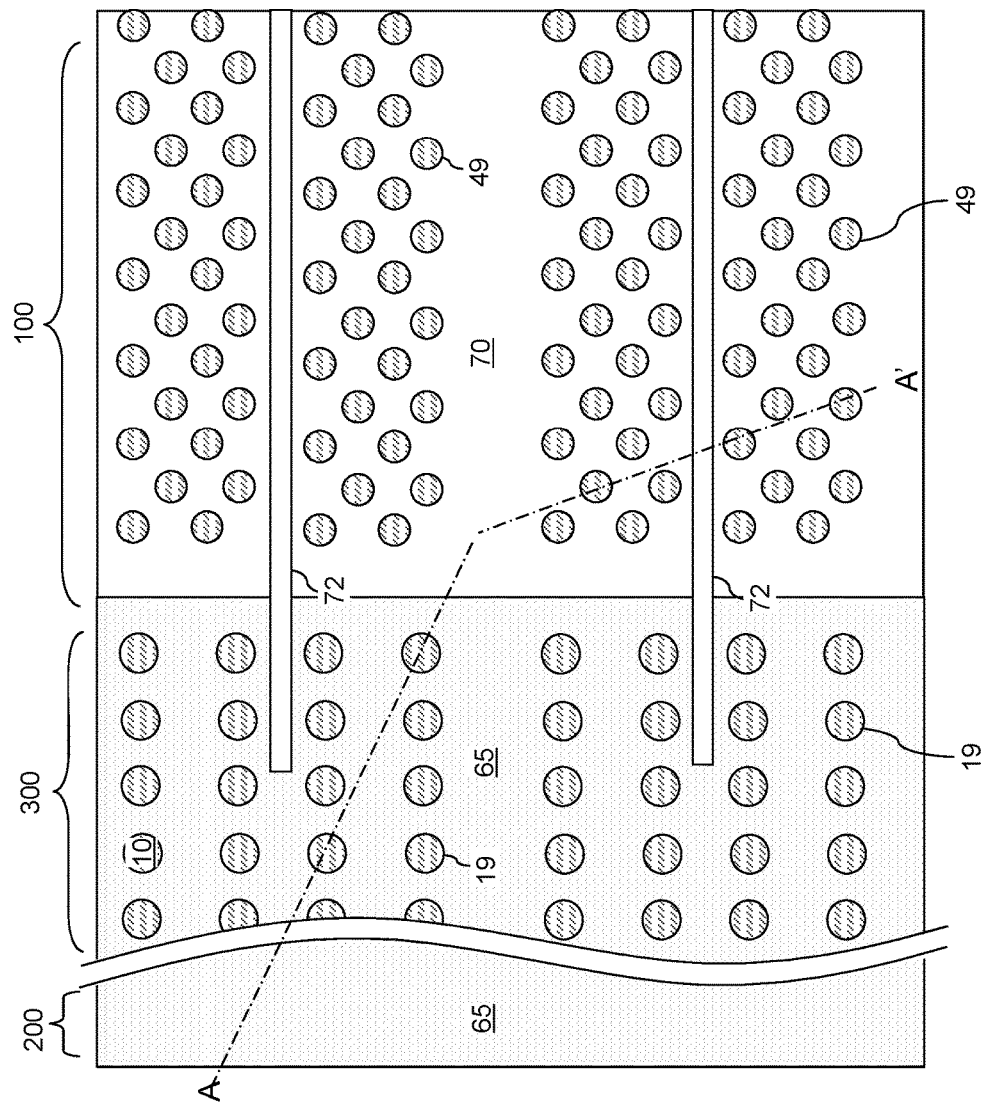
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the sacrificial cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the sacrificial cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the sacrificial cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the sacrificial cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the silicon-containing semiconductor layers 42 can be laterally recessed partially to form lateral recesses (not shown), for example, by an isotropic etch.

Referring to FIG. 5B, a stack of layers including a blocking dielectric layer 52L, a charge storage layer 54L, and a tunneling dielectric layer 56 can be sequentially deposited in the memory openings 49. The stack of the blocking dielectric layer 52L, the charge storage layer 54L, and the tunneling dielectric layer 56 constitutes a memory film 50, which can store electrical charges therein.

The blocking dielectric layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52L includes aluminum oxide. In one embodiment, the blocking dielectric layer 52L can include multiple dielectric metal oxide layers having different material compositions.

Alternatively or additionally, the blocking dielectric layer 52L can include a dielectric semiconductor compound such as silicon oxide, silicon oxynitride, silicon nitride, or a combination thereof. In one embodiment, the blocking dielectric layer 52L can include silicon oxide. In this case, the dielectric semiconductor compound of the blocking dielectric layer 52L can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52L can be omitted, and a backside blocking dielectric layer can be formed after formation of backside recesses on surfaces of memory films to be subsequently formed.

Subsequently, the charge storage layer 54L can be formed. In one embodiment, the charge storage layer 54L can be a continuous layer or patterned discrete portions of a charge trapping material including a dielectric charge trapping material, which can be, for example, silicon nitride. Alternatively, the charge storage layer 54L can include a continuous layer or patterned discrete portions of a conductive material such as doped polysilicon or a metallic material that is patterned into multiple electrically isolated portions (e.g., floating gates), for example, by being formed within lateral recesses into silicon-containing semiconductor layers 42. In one embodiment, the charge storage layer 54L includes a silicon nitride layer. In one embodiment, the silicon-containing semiconductor layers 42 and the sacrificial material layers 32 can have vertically coincident sidewalls, and the charge storage layer 54L can be formed as a single continuous layer.

The charge storage layer 54L can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54L may comprise an insulating charge trapping material, such as one or more silicon nitride segments. Alternatively, the charge storage layer 54L may comprise conductive nanoparticles such as metal nanoparticles, which can be, for example, ruthenium nanoparticles. The charge storage layer 54L can be formed, for example, by chemical vapor deposition (CVD), atomic layer deposition (ALD), physical vapor deposition (PVD), or any suitable deposition technique for storing electrical charges therein. The thickness of the charge storage layer 54L can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Referring to FIG. 5C, a first semiconductor channel layer 601 can be optionally formed. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52*l*, 54L, 56, 601).

Referring to FIG. 5D, the optional first semiconductor channel layer 601, the tunneling dielectric layer 56, the charge storage layer 54L, the blocking dielectric layer 52L are sequentially anisotropically etched employing at least one anisotropic etch process. The portions of the first semiconductor channel layer 601, the tunneling dielectric layer 56, the charge storage layer 54L, and the blocking dielectric layer 52L located above the top surface of the sacrificial cap layer 70 can be removed by the at least one anisotropic etch process. Further, the horizontal portions of the first semiconductor channel layer 601, the tunneling dielectric layer 56, the charge storage layer 54L, and the blocking dielectric layer 52L at the bottom of each memory cavity 49' can be removed to form openings in remaining portions thereof. Each of the first semiconductor channel layer 601, the tunneling dielectric layer 56, the charge storage layer 54L, and the blocking dielectric layer 52L can be etched by a respective anisotropic etch process employing a respective etch chemistry, which may, or may not, be the same for the various material layers.

Each remaining portion of the first semiconductor channel layer 601 can have a tubular configuration. The charge storage layer 54L can comprise a charge trapping material or a floating gate material. In one embodiment, each charge storage layer 54L can include a vertical stack of charge storage regions that store electrical charges upon programming. In one embodiment, the charge storage layer 54L can be a charge storage layer in which each portion adjacent to the silicon-containing semiconductor layers 42 constitutes a charge storage region.

A surface of the semiconductor material layer 10 can be physically exposed underneath the opening through the first semiconductor channel layer 601, the tunneling dielectric layer 56, the charge storage layer 54L, and the blocking dielectric layer 52L. Optionally, the physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A tunneling dielectric layer 56 is located over the charge storage layer 54L. Each memory film 50 includes a plurality of charge storage regions (as embodied as the charge storage layer 54L) that are insulated from surrounding materials by the blocking dielectric layer 52L and the tunneling dielectric layer 56. In one embodiment, the first semiconductor channel layer 601, the tunneling dielectric layer 56, the charge storage layer 54L, and the blocking dielectric layer 52L can have vertically coincident sidewalls.

Referring to FIG. 5E, a second semiconductor channel layer 602 can be deposited directly on the semiconductor surface of the semiconductor material layer 10, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the sacrificial cap layer 70. The remaining portions of the dielectric core layer 62L can be further recessed vertically so that each remaining portion of the dielectric core layer 62L includes a top surface located between a first horizontal plane including a top surface of the sacrificial cap layer 70 and a second horizontal plane including a bottom surface of the sacrificial cap layer 70. Each remaining portion of the dielectric core layer 62L constitutes a dielectric core 62.

Referring to FIG. 5H, the horizontal portion of the second semiconductor channel layer 602 located above the top surface of the sacrificial cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54L, and laterally surrounds a portion of the vertical semiconductor channel 60. Each adjoining set of a blocking dielectric layer 52L, a charge storage layer 54L, and a tunneling dielectric layer 56 collectively constitute a memory film 50, which can store electrical charges with a macroscopic retention time. In some embodiments, a blocking dielectric layer 52L may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the sacrificial cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54L, and an optional blocking dielectric layer 52L. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 fills the respective support openings 19, and constitutes a support pillar structure.

Figure 6:
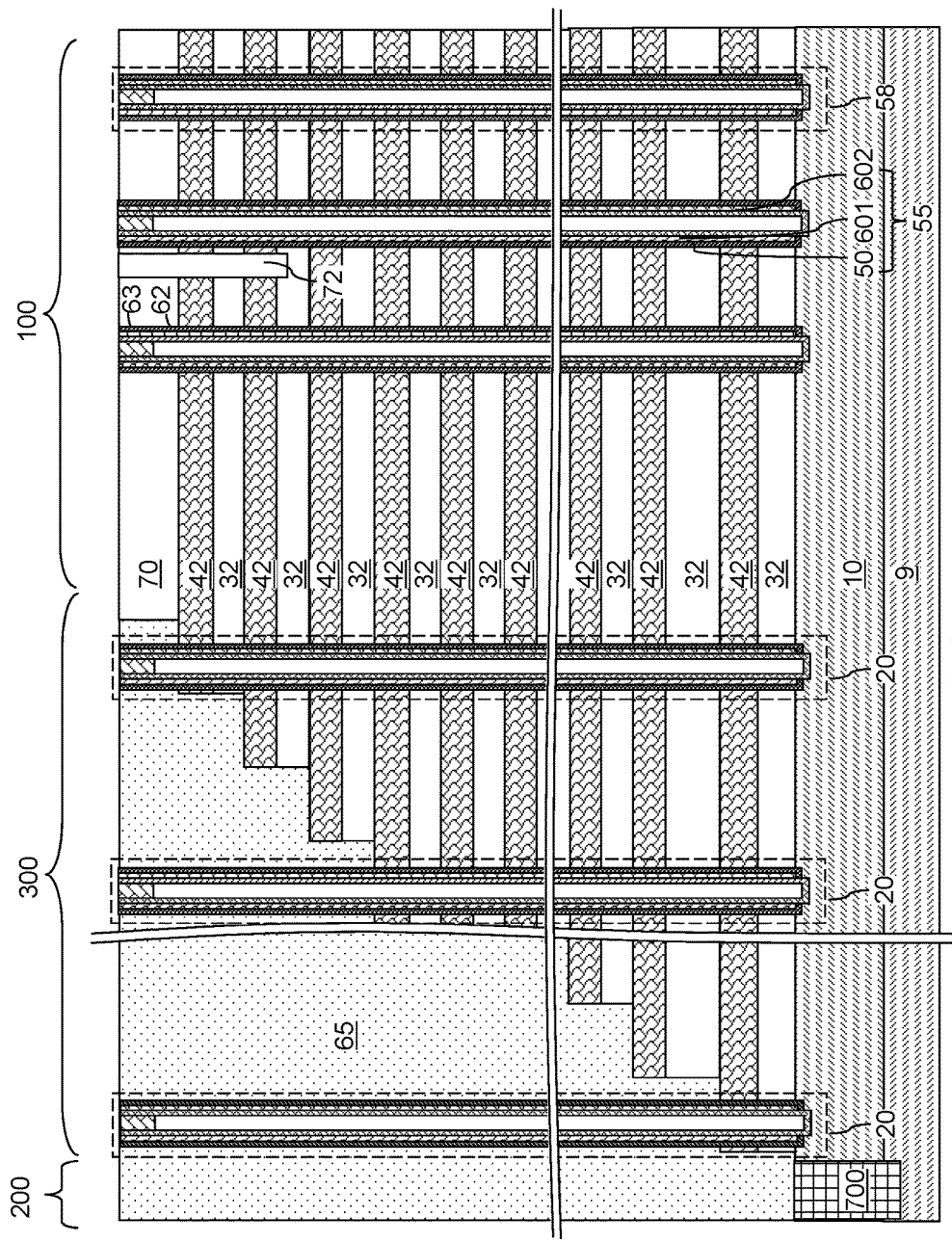
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a charge storage layer 54L) and an optional blocking dielectric layer 52L. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Each tunneling dielectric layer 56 and each charge storage layer 54L in the memory films 50 continuously extend at least from a topmost one of the sacrificial material layers 32 to a bottommost one of the sacrificial material layers 32. The support pillar structures 20 vertically extend through the vertically alternating sequence of the sacrificial material layers 32 and silicon-containing semiconductor layers 42 and the retro-stepped dielectric material portion 65, and contact the substrate (9, 10). The support pillar structures 20 can be formed concurrently with formation of the memory opening fill structures 58, which include the memory stack structures 55.

Figure 7A:
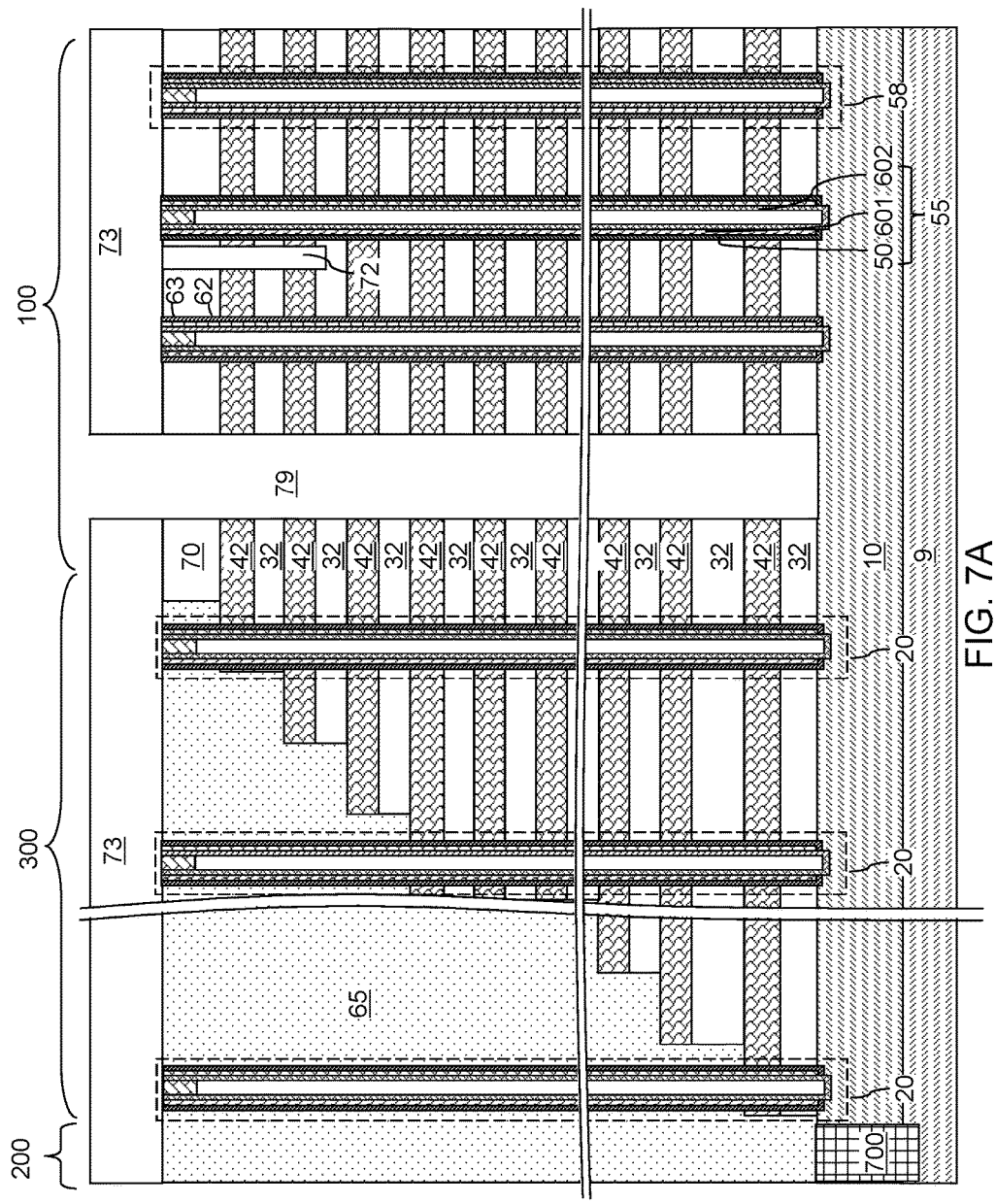
FIG. 7A is a schematic vertical cross-sectional view of the exemplary structure after formation of backside trenches according to an embodiment of the present disclosure.
Figure 7B:
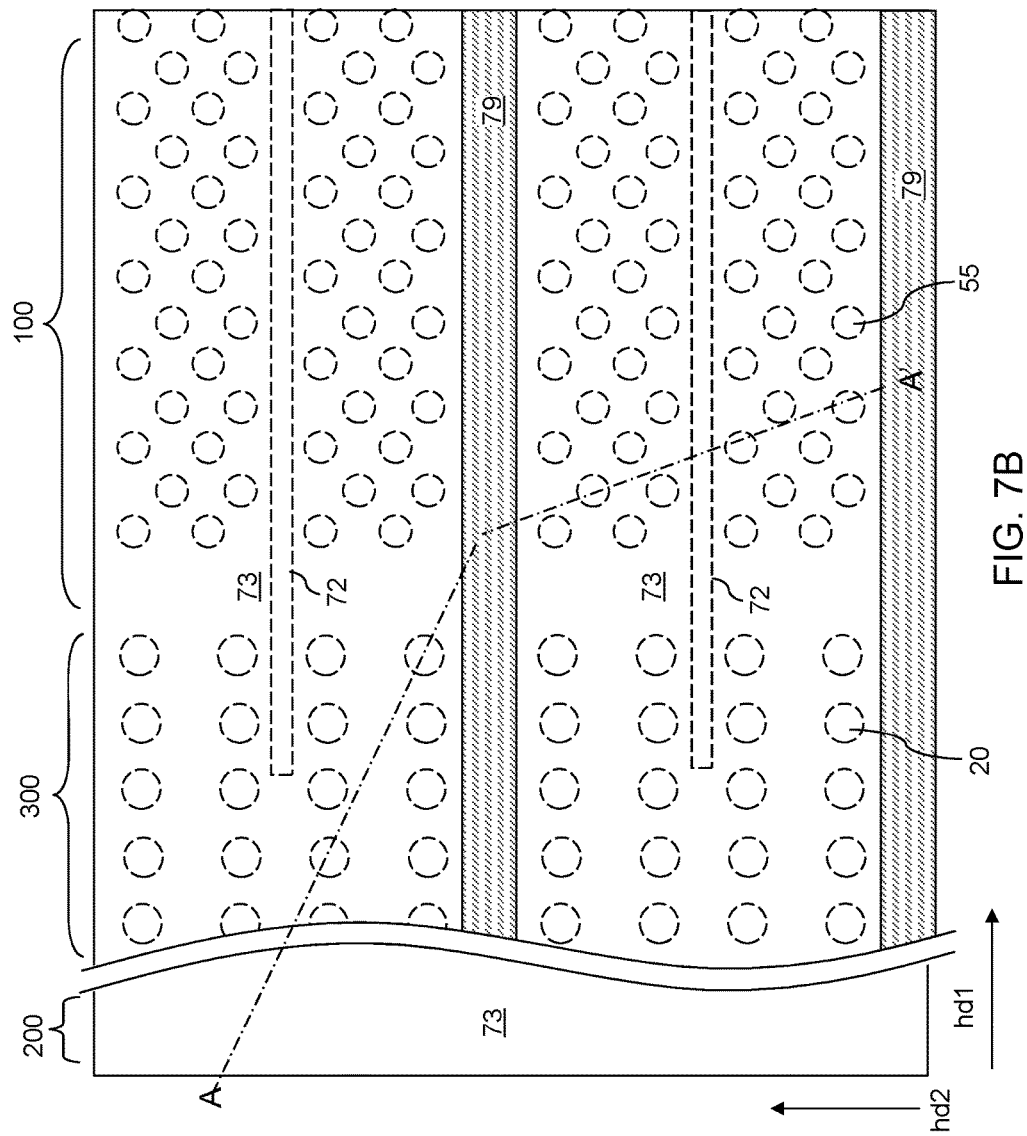
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of sacrificial material layer 32 and silicon-containing semiconductor layers 42, and over the memory stack structures 55 and the support pillar structures 20. The contact level dielectric layer 73 includes a dielectric material that is different from the dielectric material of the sacrificial material layers 32. For example, the contact level dielectric layer 73 can include undoped silicate glass, and the sacrificial material layers 32 can include borosilicate glass or porous or non-porous organosilicate glass (OSG). The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation trench 72, or between a neighboring pair of drain-select-level isolation trenches 72. In one embodiment, the backside trenches 79 can include a source contact opening in which a source contact via structure can be subsequently formed. The photoresist layer can be removed, for example, by ashing.

Figure 8:
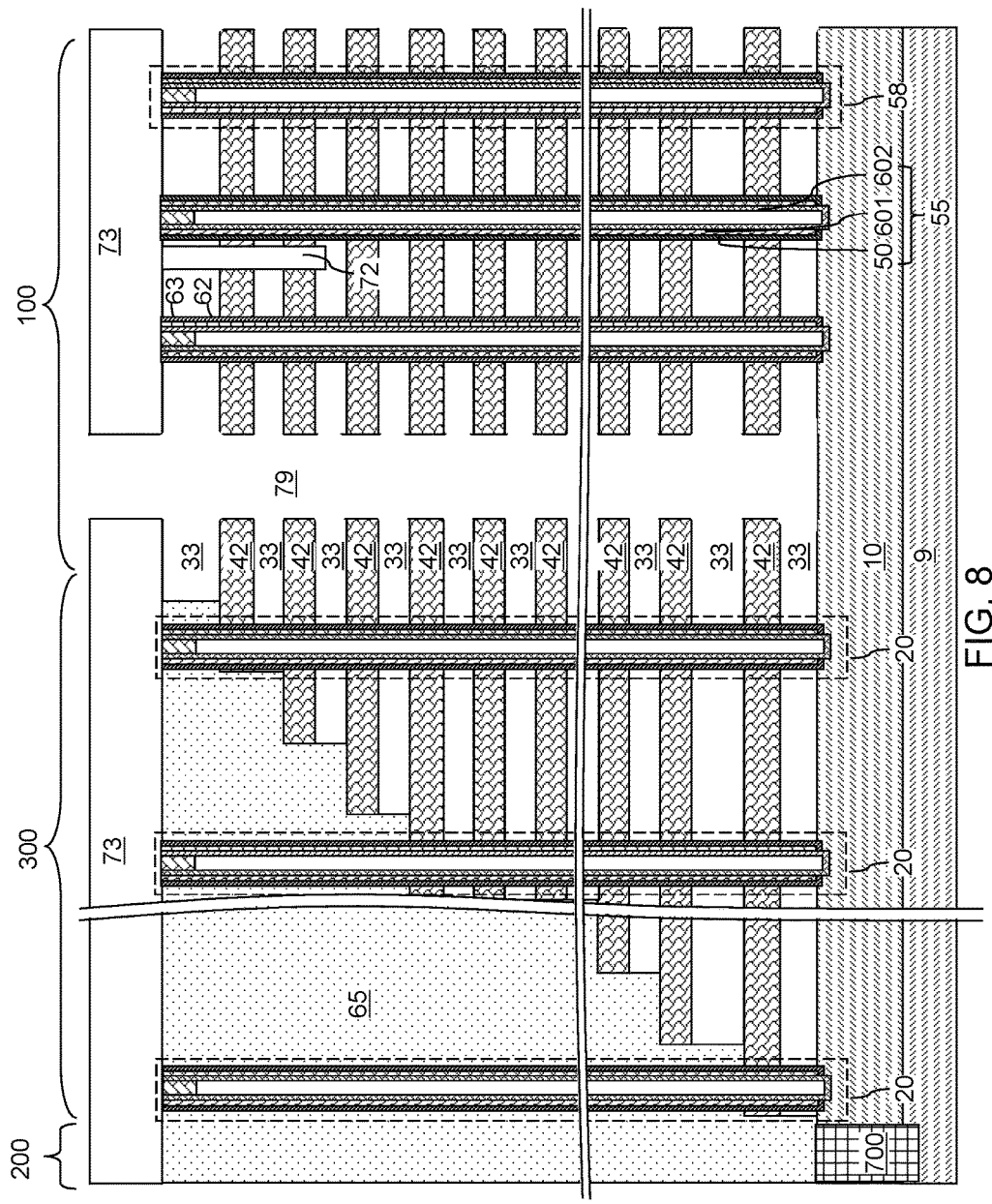
FIG. 8 is a schematic vertical cross-sectional view of the exemplary structure after formation of backside recesses by removal of the sacrificial material layers selective to the silicon-containing semiconductor layers according to an embodiment of the present disclosure.

Referring to FIG. 8, an isotropic etchant that selectively etches the material of the sacrificial material layers 32 with respect to the material of the silicon-containing semiconductor layers 42 can be introduced into the backside trenches 79 employing an isotropic etch process. Backside recesses 33 are formed in volumes from which the sacrificial material layers 32 are removed. The removal of the material of the sacrificial material layers 32 can be selective to the materials of the silicon-containing semiconductor layers 42, the retro-stepped dielectric material portion 65, the contact level dielectric layer 73, the semiconductor material of the semiconductor material layer 10, and the material of the outermost layer of the memory films 50. In one embodiment, the sacrificial material layers 32 and the sacrificial cap layer 70 can include borosilicate glass or porous or non-porous organosilicate glass, the silicon-containing semiconductor layers 42 can include doped or undoped polysilicon, the retro-stepped dielectric material portion 65 and the contact level dielectric layer 73 can include undoped silicate glass, the blocking dielectric layer 52L in the memory films 50 can include aluminum oxide, and the semiconductor material layer 10 can include single crystalline silicon. Removal of the sacrificial material layers 32 can be performed selective to the retro-stepped dielectric material portion 65. Sidewalls of the retro-stepped dielectric material portion 65 can be physically exposed to the backside recesses 33.

The etch process that removes the sacrificial material layers 32 selective to the materials of the silicon-containing semiconductor layers 42 and the outermost layer of the memory films 50 can be a wet etch process employing a wet etch solution, or can be a gas phase (dry) etch process in which the etchant is introduced in a vapor phase into the backside trenches 79. For example, if the sacrificial material layers 32 include borosilicate glass or porous or non-porous organosilicate glass, the etch process can be a wet etch process in which the exemplary structure is immersed within a wet etch tank including dilute hydrofluoric acid, which can etch borosilicate glass or porous or non-porous organosilicate glass selective to undoped silicate glass, silicon, and various other materials employed in the art. In one embodiment, sidewalls of the retro-stepped dielectric material portion 65 can be physically exposed to the backside recesses 33. The support pillar structure 20, the retro-stepped dielectric material portion 65, and the memory stack structures 55 provide structural support while the backside recesses 33 are present within volumes previously occupied by the silicon-containing semiconductor layers 42.

Each backside recess 33 can be a laterally extending cavity having a lateral dimension that is greater than the vertical extent of the cavity. In other words, the lateral dimension of each backside recess 33 can be greater than the height of the backside recess 33. A plurality of backside recesses 33 can be formed in the volumes from which the sacrificial material layers 32 are removed. The memory openings in which the memory stack structures 55 are formed are herein referred to as front side openings or front side cavities in contrast with the backside recesses 33. In one embodiment, the memory array region 100 comprises an array of monolithic three-dimensional NAND strings having a plurality of device levels disposed above the substrate (9, 10). In this case, each backside recess 33 can define a space for receiving a respective word line of the array of monolithic three-dimensional NAND strings.

Each of the plurality of backside recesses 33 can extend substantially parallel to the top surface of the substrate (9, 10). A backside recess 33 can be vertically bounded by a top surface of an underlying silicon-containing semiconductor layer 42 and a bottom surface of an overlying silicon-containing semiconductor layer 42. In one embodiment, each backside recess 33 can have a uniform height throughout.

Figure 9:
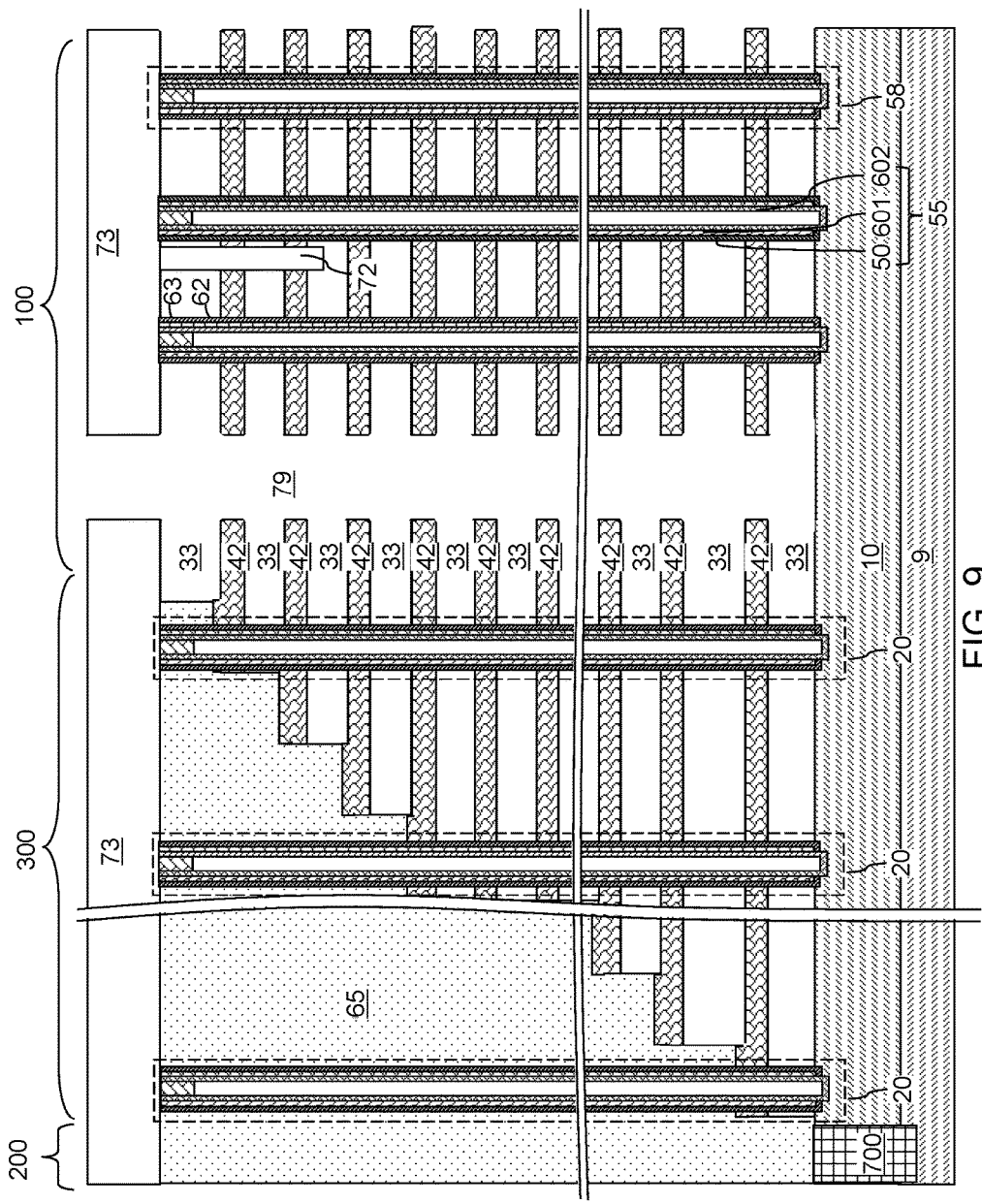
FIG. 9 is a schematic vertical cross-sectional view of the exemplary structure after selective thinning of the silicon-containing semiconductor layers according to an embodiment of the present disclosure.

Referring to FIG. 9, the silicon-containing semiconductor layers 42 can be optionally thinned without etching the memory stack structures 55. An isotropic etch can be performed to remove surface portions of the silicon-containing semiconductor layers 42. For example, a wet etch process employing a dilute mixture of hydrofluoric acid, nitric acid, ammonium fluoride, and/or potassium hydroxide may be employed to isotropically etch surface portions of the silicon-containing semiconductor layers 42. The top surface of the semiconductor material layer 10 may be collaterally recessed during the wet etch process. The thickness of each silicon-containing semiconductor layers 42 after thinning may be in a range from 5 nm to 45 nm, such as from 10 nm to 30 nm, although lesser and greater thicknesses can also be employed.

A top surface and a bottom surface of each silicon-containing semiconductor layer 42 can be thinned during the isotropic etch process. Top surfaces of the silicon-containing semiconductor layers 42 that contact bottom surfaces of the retro-stepped dielectric material portion 65 are not recessed during the isotropic etch process. Thus, each silicon-containing semiconductor layer 42 can have a thinner region that does not contact the retro-stepped dielectric material portion 65 and a thicker region that contacts a bottom surface of the retro-stepped dielectric material portion 65. The thinner region of each silicon-containing semiconductor layer 42 extends across the memory array region 100 and the contact region 300. The thicker region of each silicon-containing semiconductor layer 42 is located entirely within the contact region 300.

Figure 10:
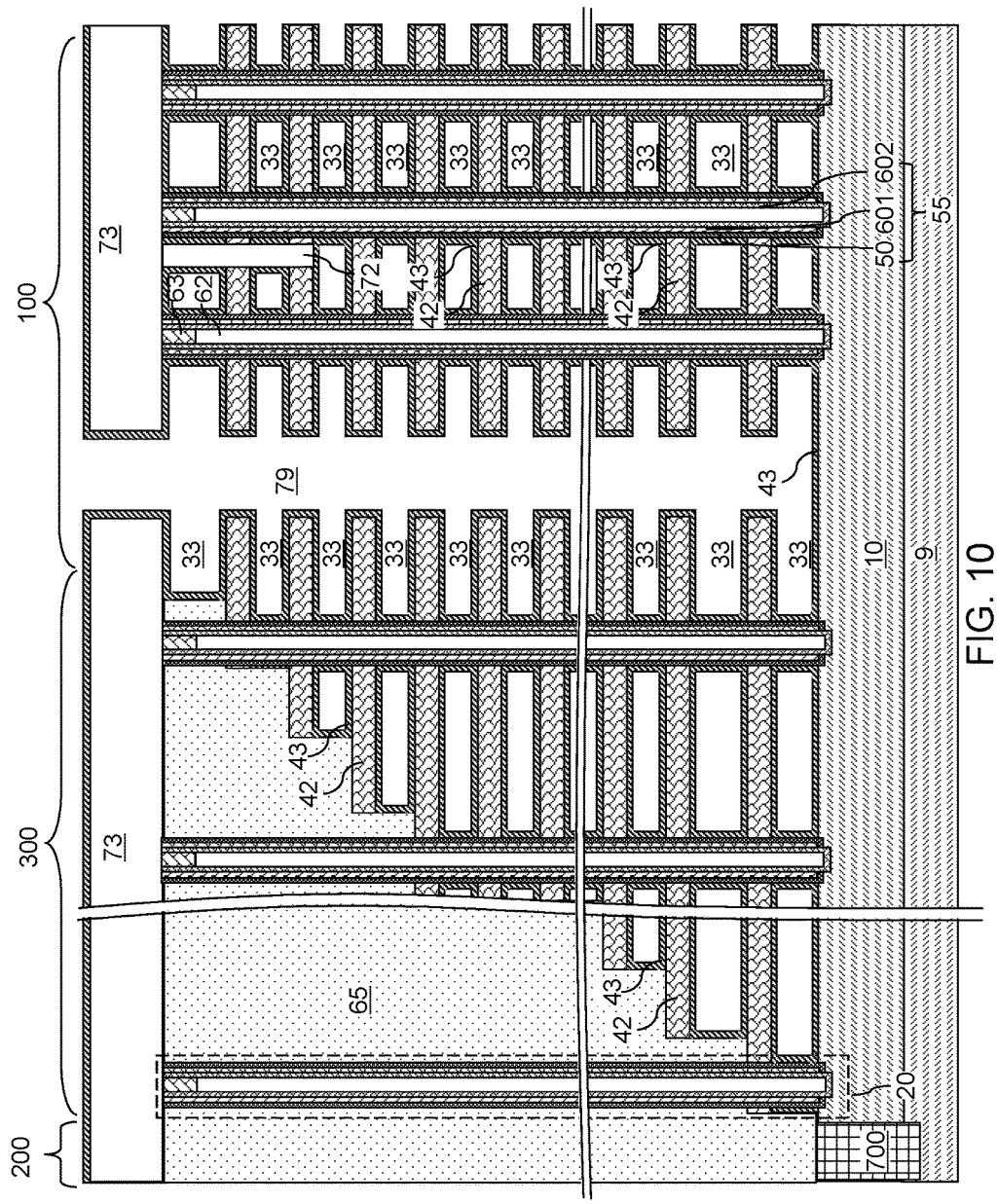
FIG. 10 is a schematic vertical cross-sectional view of the exemplary structure after deposition of a metal layer according to an embodiment of the present disclosure.

Referring to FIG. 10, a metal layer 43 can be deposited in the backside recesses 33 and the backside trenches 79 and over the contact level dielectric layer 73. The metal layer 43 includes a metal that can form a metal silicide upon silicidation. For example, the metal layer 43 can include a metal such as cobalt, nickel, titanium, tungsten, platinum, molybdenum, palladium, and alloys thereof. If the thinning process of FIG. 9 is performed, the metal layer 43 can be deposited conformally on remaining portions of the silicon-containing semiconductor material as thinned at the processing steps of FIG. 9. The metal layer 43 can be deposited by a conformal deposition process such as atomic layer deposition (ALD) or chemical vapor deposition (CVD). The thickness of the metal layer 43 can be less than one half of the minimum height of the backside recesses 33. For example, the metal layer 43 can have a thickness in a range from 5 nm to 25 nm, such as from 10 nm to 20 nm, although lesser and greater thicknesses can also be employed.

In one embodiment, the thickness of the metal layer 43 can be uniform throughout the entirety of the metal layer 43. In another embodiment, the conformal deposition process that deposits the metal layer 43 can provide less than perfect conformity. In this case, portions of the metal layer 43 located in the backside recesses 33 and distal from the backside trenches 79 can have a lesser thickness than portions of the metal layer 43 located in the backside recesses 33 and proximal to the backside trenches 79. In this case, the thinnest portion of the metal layer 43 in the backside recesses 33 may have a thickness in a range from 30% to 98%, such as from 50% to 80%, of the thickest portion of the metal layer 43 in the backside recesses 33. The maximum thickness of the metal layer 43 in the backside recesses 33 can be in a range from 5 nm to 25 nm, such as from 10 nm to 20 nm, although lesser and greater thicknesses can also be employed.

Figure 11:
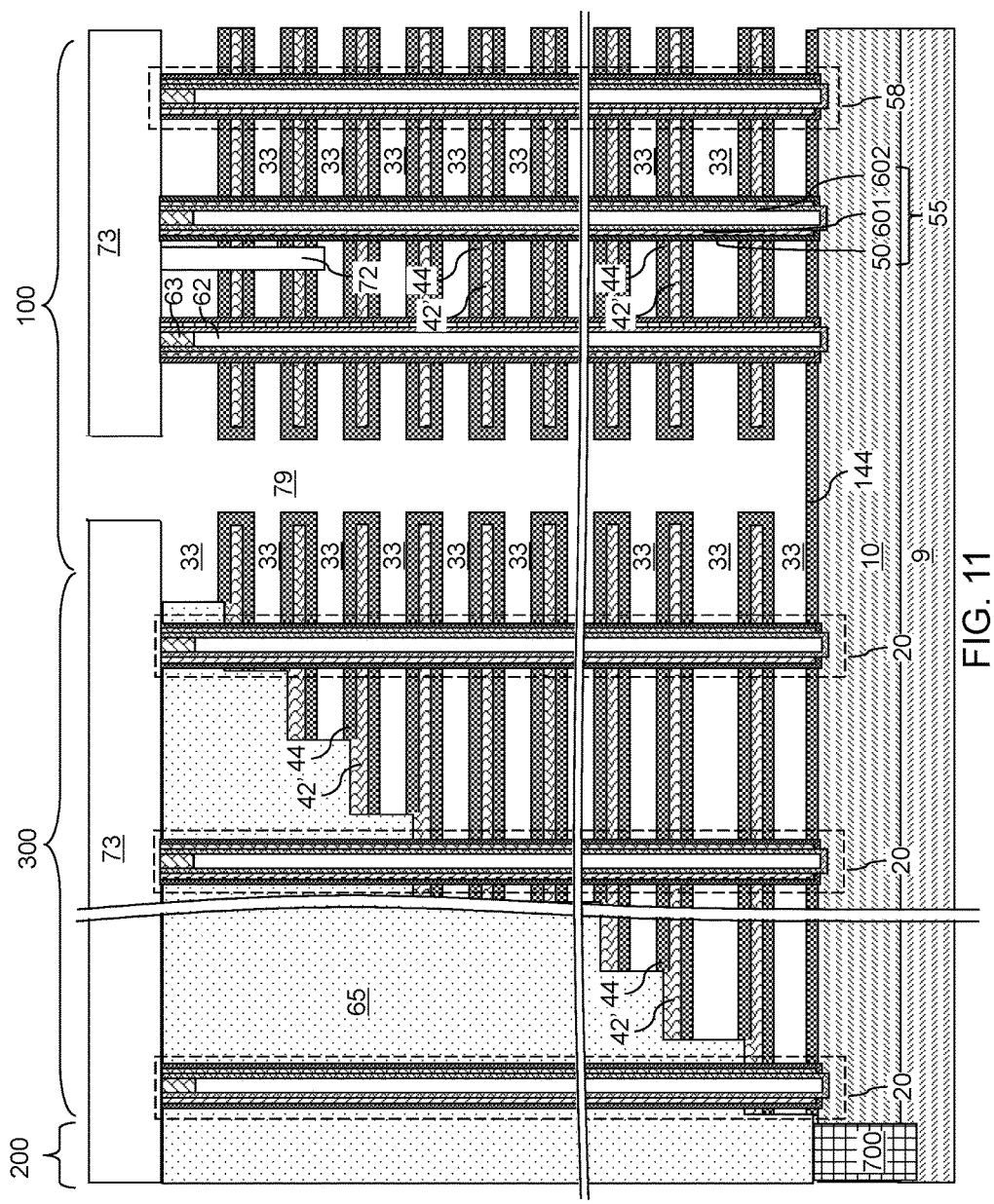
FIG. 11 is a schematic vertical cross-sectional view of the exemplary structure after formation of composite electrically conductive layers including a respective pair of a silicon-containing semiconductor core layer and a metal silicide shell layer according to an embodiment of the present disclosure.

Referring to FIGS. 11 and 12A, a silicidation process is performed, which includes an anneal process that is performed at an elevated temperature. The silicon-containing semiconductor material of the silicon-containing semiconductor layers 42 and the metal of the metal layer 43 react to form metal silicide layers that include a metal silicide material. As such, the metal silicide material includes the metal atoms of the metal layer 43 and silicon atoms. In one embodiment, the metal silicide can include cobalt silicide, nickel silicide, titanium silicide, tungsten silicide, platinum silicide, molybdenum silicide, palladium silicide, or an alloy thereof. The unreacted remaining portion of each silicon-containing semiconductor layer 42 includes the same silicon-containing semiconductor material prior to the silicidation process, constitutes a core portion of a composite electrically conductive layer. As such, each remaining portion of each silicon-containing semiconductor layer 42 is herein referred to as a silicon-containing semiconductor core layer 42'.

Each continuous portion of the metal silicide material on the silicon-containing semiconductor core layers 42' encloses a respective one of the silicon-containing semiconductor core layers 42' as a shell structure, and is herein referred to as a metal silicide shell layer 44. Each metal silicide shell layer 44 includes a metal silicide material derived from the silicon-containing semiconductor material and the metal. Each metal silicide shell layer 44 contacts the top surface, bottom surface and back sidewall of the respective semiconductor core layer 42', but does not cover the front sidewall of the respective semiconductor core layer 42'. A back sidewall of the semiconductor core layer 42' is an edge surface which faces the backside trench 79. The front sidewall of the semiconductor core layer 42' is the opposite edge surface which faces (and optionally contacts) the memory film 50 (e.g., contacts the blocking dielectric part of the memory film).

In one embodiment, the portion of the metal layer 43 deposited on the top surface of the semiconductor material layer 10 reacts with a surface portion of the semiconductor material layer 10 to form a continuous layer of a metal silicide material. The continuous layer of the metal silicide material on the semiconductor material layer 10 is herein referred to as a substrate metal silicide layer 144. The substrate metal silicide layer 144 can be formed concurrently with formation of the metal silicide shell layers 44.

Unreacted portions of the metal from the metal layer 43 can be removed selective to the metal silicide materials of the metal silicide shell layers 44 and the substrate metal silicide layer 144. Removal of the unreacted portions of the metal from the metal layer 43 can be performed, for example, by a wet etch process that etches the metal selective to the metal silicide. For example, a wet etch process employing an acidic and oxidizing mixture (such as a sulfuric acid-hydrogen peroxide mixture) or an oxidizing and aqueous mixture, either alkaline ($NH_4OH/H_2O_2/H_2O$) or acidic ($HNO_3/H_2O$), may be employed.

Thus, composite electrically conductive layers (42', 44) are formed in the exemplary structure by reacting the metal layer 43 with surface portions of the remaining portions of the silicon-containing semiconductor material. Each composite electrically conductive layer (42', 44) includes a silicon-containing semiconductor core layer 42' including an unreacted portion of the silicon-containing semiconductor material and a metal silicide shell layer 44 including a metal silicide material derived from the silicon-containing semiconductor material and the metal of the metal layer 43.

In one embodiment, the metal layer 43 can have a uniform thickness prior to the silicidation process, and the metal silicide shell layer 44 can have a uniform thickness throughout. In this case, each silicon-containing semiconductor core layer 42' can have a uniform thickness in regions that do not contact a bottom surface of the retro-stepped dielectric material portion 65. In another embodiment, the metal layer 43 can have a graded thickness due to less than perfect conformal coverage during the conformal deposition process that forms the metal layer 43. In this case, the thickness of the meal silicide material can decrease inside the backside recesses 33 with a lateral distance from the backside trenches 79. Correspondingly, consumption of the silicon-containing semiconductor material of the silicon-containing semiconductor layers 42 can decrease with a lateral distance from the backside trenches 79. Thus, within each composite electrically conductive layer (42', 44), the silicon-containing semiconductor core layer 42' can have a first variable thickness that increases with a lateral distance from a most proximal one of the backside trenches 79, and the metal silicide shell layer 44 can have a second variable thickness that decreases with the lateral distance from the most proximal one of the backside trenches 79. The maximum thickness of each horizontal portion of the metal silicide shell layer 44 can be in a range from 5 nm to 20 nm, such as from 7 nm to 15 nm, although lesser and greater thicknesses can also be employed. The maximum thickness of each silicon-containing semiconductor core layer 42' can be in a range from 5 nm to 20 nm, such as from 7 nm to 15 nm, although lesser and greater thicknesses can also be employed.

At the processing step of FIG. 12A, each memory film 50 includes a tunneling dielectric layer 56 and a charge storage layer 54L that continuously extend at least from a topmost one of the composite electrically conductive layers (42', 44) to a bottommost one of the sacrificial material layers (42', 44). Each tunneling dielectric layer 56 and each charge storage layer 54L can extend into a top portion of the substrate (9, 10).

Referring to FIG. 12B, each physically exposed portion of the blocking dielectric layers 52L can be etched by an isotropic etchant selective to the material of the metal silicide shell layer 44 and the substrate metal silicide layer 144. If the blocking dielectric layer 52L includes silicon oxide, then a wet etch process (e.g., a hydrofluoric acid wet etch process) that etches the dielectric metal oxide material selective to the metal silicide materials of the metal silicide shell layer 44 and the substrate metal silicide layer 144 can be employed. If the blocking dielectric layer 52L includes a dielectric metal oxide material, then a wet etch process that etches the dielectric metal oxide material selective to the metal silicide materials of the metal silicide shell layer 44 and the substrate metal silicide layer 144 can be employed. For example, if the blocking dielectric layer 52L includes aluminum oxide, a wet etch solution including a mixture of ammonium hydroxide, hydrogen peroxide, and water, or a mixture including one or more complexing agents and a buffering agent for maintaining pH of the aqueous wet etchant solution within a pH range between approximately 9 and approximately 10 as described in U.S. Patent Application Publication No. US 2004/0061092 A1. Each physically exposed portion of the blocking dielectric layers 52L can be removed from the memory films 50. Remaining portions of the blocking dielectric layers 52L include discrete blocking dielectrics 52, which can be annular cylindrical structures. A discrete blocking dielectric 52 can include a cylindrical outer sidewall that contacts a respective one of the composite electrically conductive layers (42', 44).

Subsequently, each physically exposed portion of the charge storage layers 54L can be etched by an isotropic etchant selective to the material of the tunneling dielectric layers 56. For example, if the charge storage layers 54L includes silicon nitride and if the tunneling dielectric layers 56 include silicon oxide, a wet etch process employing hot phosphoric acid can be employed. Each physically exposed portion of the charge storage layers 54L can be removed from the memory films 50 at levels of the backside recesses 33. Remaining portions of charge storage layers 54L include discrete charge storage material portions 54, which can be annular cylindrical structures. Each discrete charge storage material portion 54 can include a cylindrical outer sidewall that contacts an inner cylindrical sidewall of a discrete blocking dielectric 52, and a cylindrical inner sidewall that contacts a portion of an outer sidewall of a respective one of the tunneling dielectric layers 56. Thus, each charge storage layer 54L of the memory films 50 can be divided into a plurality of discrete charge storage material portions 54 located at each level of the composite electrically conductive layers (42', 44).

Division of the charge storage layers 54L that continuously extend across all levels of the composite electrically conductive layers (42', 44) into discrete charge storage material portions 54 prevents or reduces vertical diffusion of stored electrical charges in charge storage elements. Specifically, each discrete charge storage material portions 54 can function as a discrete charge storage element that is electrically isolated among one another, and thus, do not include vertically interconnecting charge diffusion paths. Thus, use of the discrete charge storage material portions 54 instead of charge storage layers 54L as charge storage elements provides the advantage of enhanced charge retention and enhanced data reliability.

Figure 12C:
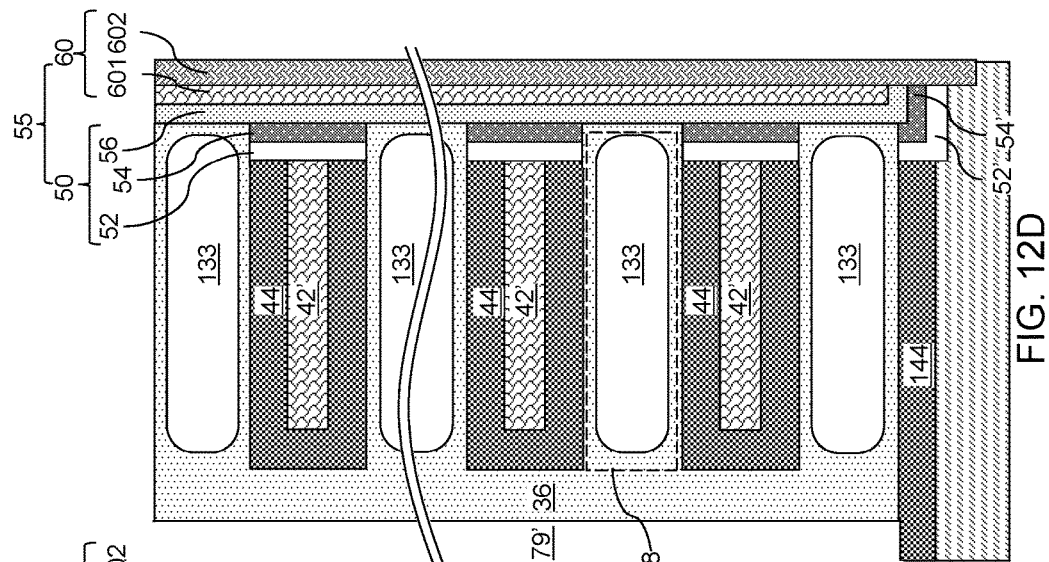

Referring to FIG. 12C, a dielectric material can be anisotropically deposited into the backside trenches 79 by a non-conformal deposition process. The dielectric material can include undoped silicate glass, doped silicate glass, or porous or non-porous organosilicate glass (OSG). The non-conformal deposition process can include a plasma enhanced chemical vapor deposition process with significant depletion of reactants, and/or a physical vapor deposition process. A continuous dielectric material portion 36' is formed over the contact level dielectric layer 73 and within each backside trench 79 and portions of the backside recesses 33 that are adjoined to a respective proximate one of the backside trenches 79. An unfilled cavity can be present at a center portion of each backside trench 79 after formation of the continuous dielectric material portion 36'. In one embodiment, a thin liner of the deposited dielectric material can be formed on all physically exposed surfaces of the composite electrically conductive layers (42', 44) and the retro-stepped dielectric material portion 65.

In one embodiment, the continuous dielectric material portion 36' can include vertically-extending dielectric material portions formed in the backside trenches 79 and cavity-containing layers 38 formed in the backside recesses 33 and adjoined to the vertically-extending dielectric material portions. Each cavity-containing layer 38 of the continuous dielectric material portion 36' can include a cavity 133 therein. As used herein, a "cavity" refers to a volume that is free of any solid or any liquid therein, and is defined by a set of at least one encapsulating outer surface that does not include any opening therein. Each cavity 133 may be under vacuum, or may be filled with at least one gas depending on the process conditions during, and after, deposition of the dielectric material of the continuous dielectric material portion 36'. If the cavity 133 is filled with air, then the cavity 133 is considered an air gap.

Each cavity 133 can continuously extend laterally between a neighboring pair of backside trenches 79 and can laterally surround each of the memory stack structures 55 that extend between a vertically neighboring pair of composite electrically conducive layers (42', 44). In one embodiment, the dielectric material of the cavity-containing layers 38 can be deposited directly on physically exposed sidewalls of the retro-stepped dielectric material portion 65. In one embodiment, the dielectric material in the cavity-containing layers 38 of the continuous dielectric material portion 36' can be deposited on, and can laterally surround, the support pillar structures 20.

Figure 12D:
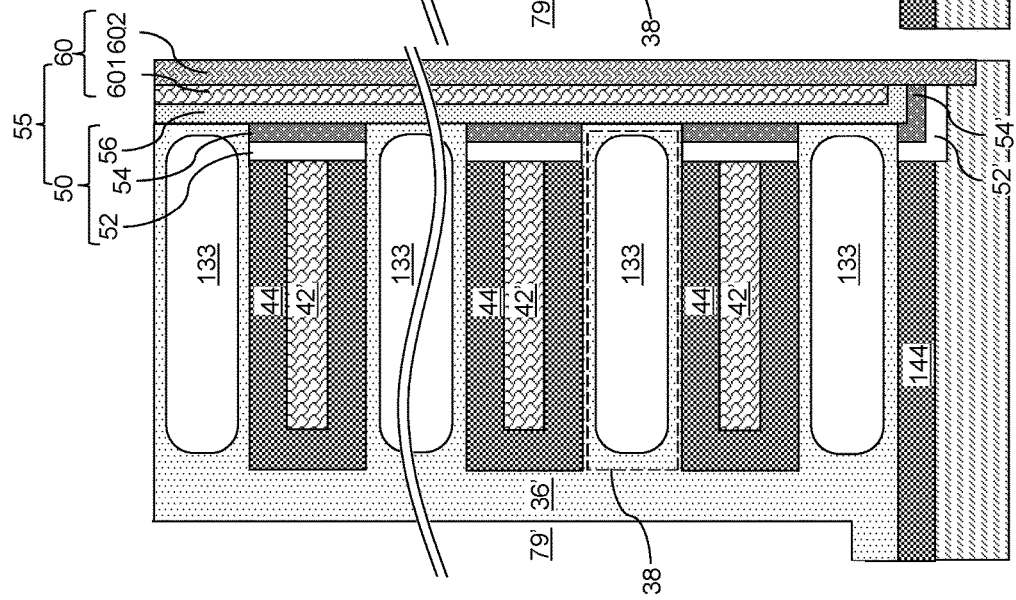
Figure 13:
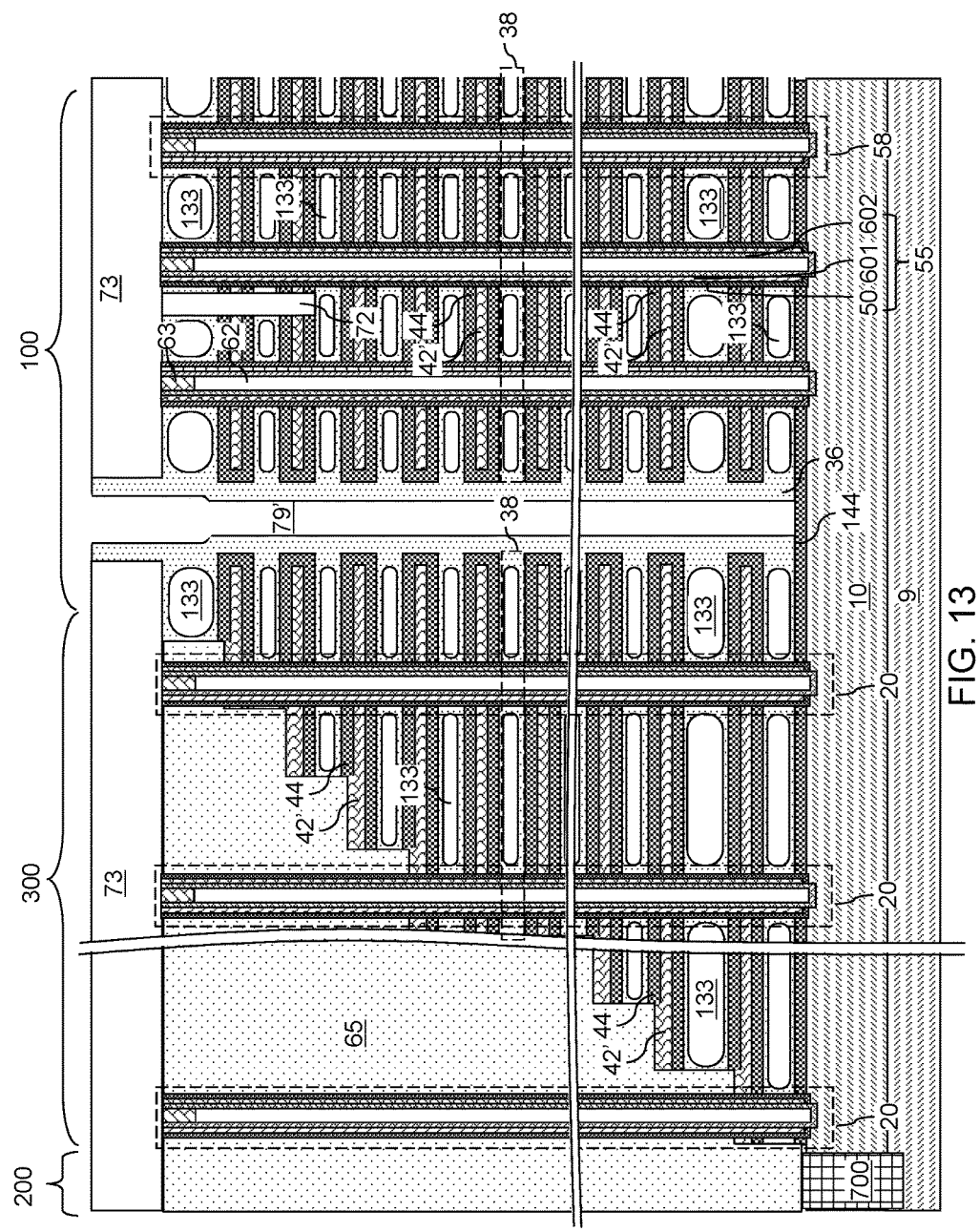
FIG. 13 is a schematic vertical cross-sectional view of the exemplary structure at the processing step of FIG. 12D.

Referring to FIGS. 12D and 13, the horizontal portion of the continuous dielectric material portion 36' overlying the contact level dielectric layer 73 and the horizontal portions of the continuous dielectric material portion 36' located at the bottom of each backside trench 79 can be removed by an anisotropic etch process. Each remaining dielectric material portion 36 includes an annular vertically-extending dielectric material portion located in a backside trench 79 and cavity-containing layers 38 located in the backside recesses 33 and adjoined to the annular vertically-extending dielectric material portion.

Two dielectric material portions 36 located in adjacent backside trenches 79 may be adjoined to each other through a set of cavity-containing layers 38 that are adjoined to both of the dielectric material portions 36. Each cavity 133 can be vertically spaced from vertically adjacent composite electrically conductive layers (42', 44) by a respective liner portion (which is a solid portion) of the cavity-containing liners. In such cases, direct contact between the cavities 133 and the composite electrically conductive layers (42', 44) may not exist. Alternatively, liner portions of the cavity-containing layers 38 may be disjoined between the neighboring pair of backside trenches 79, and two dielectric material portions 36 located in adjacent backside trenches 79 may not be adjoined to each other. In such cases, direct contact between the cavities 133 and the composite electrically conductive layers (42', 44) may exist.

The cavity-containing layers 38 and the composite electrically conductive layers (42', 44) constitute an alternating stack (38, 42', 44) through which the memory stack structures 55 vertically extend. The composite electrically conductive layers (42', 44) can include word lines for the memory stack structures 55. A backside cavity 79' is present within each annular vertically-extending dielectric material portion of the dielectric material portions 36.

Figure 14A:
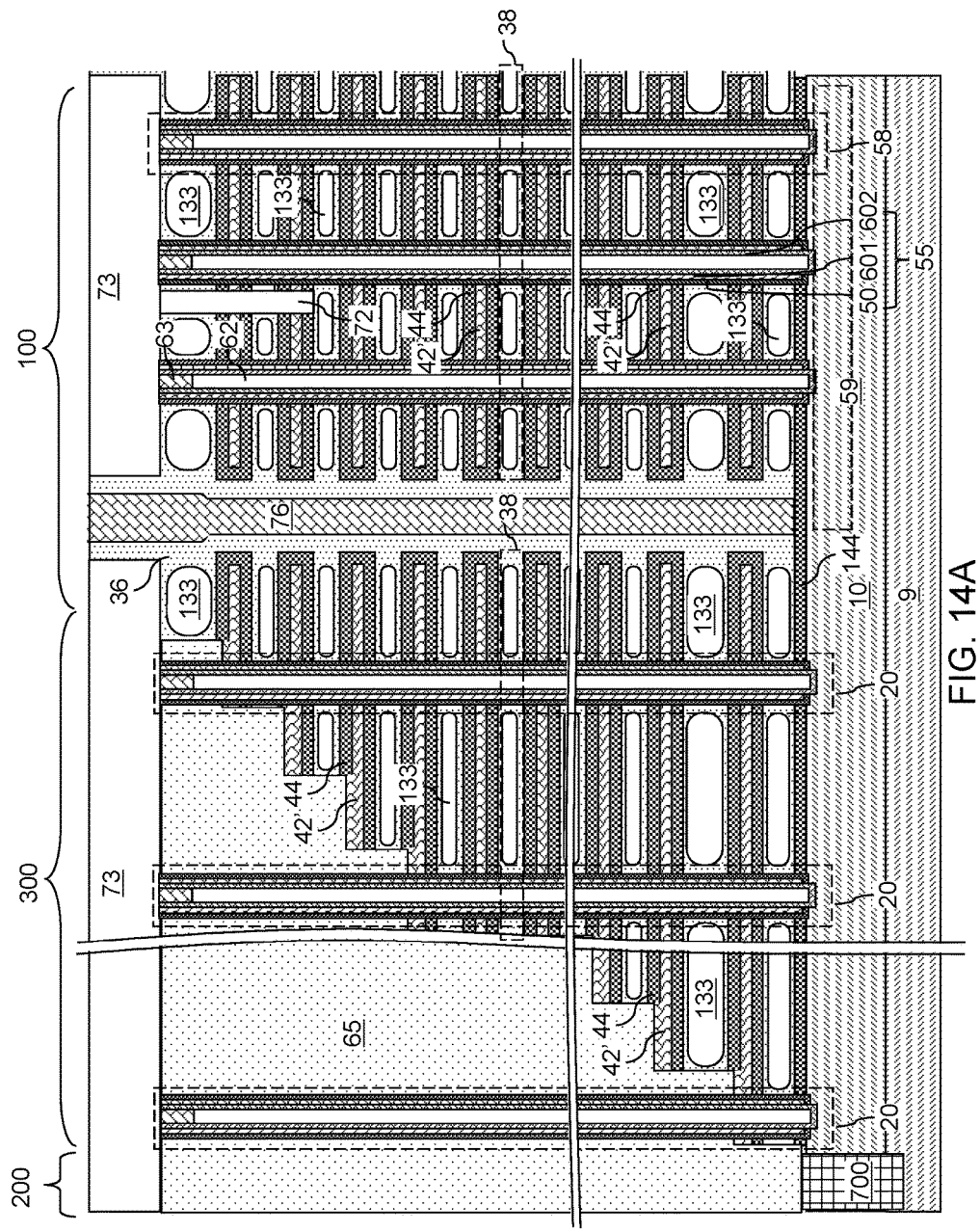
FIG. 14A is a schematic vertical cross-sectional view of the exemplary structure after formation of backside contact via structures according to an embodiment of the present disclosure.
Figure 14B:
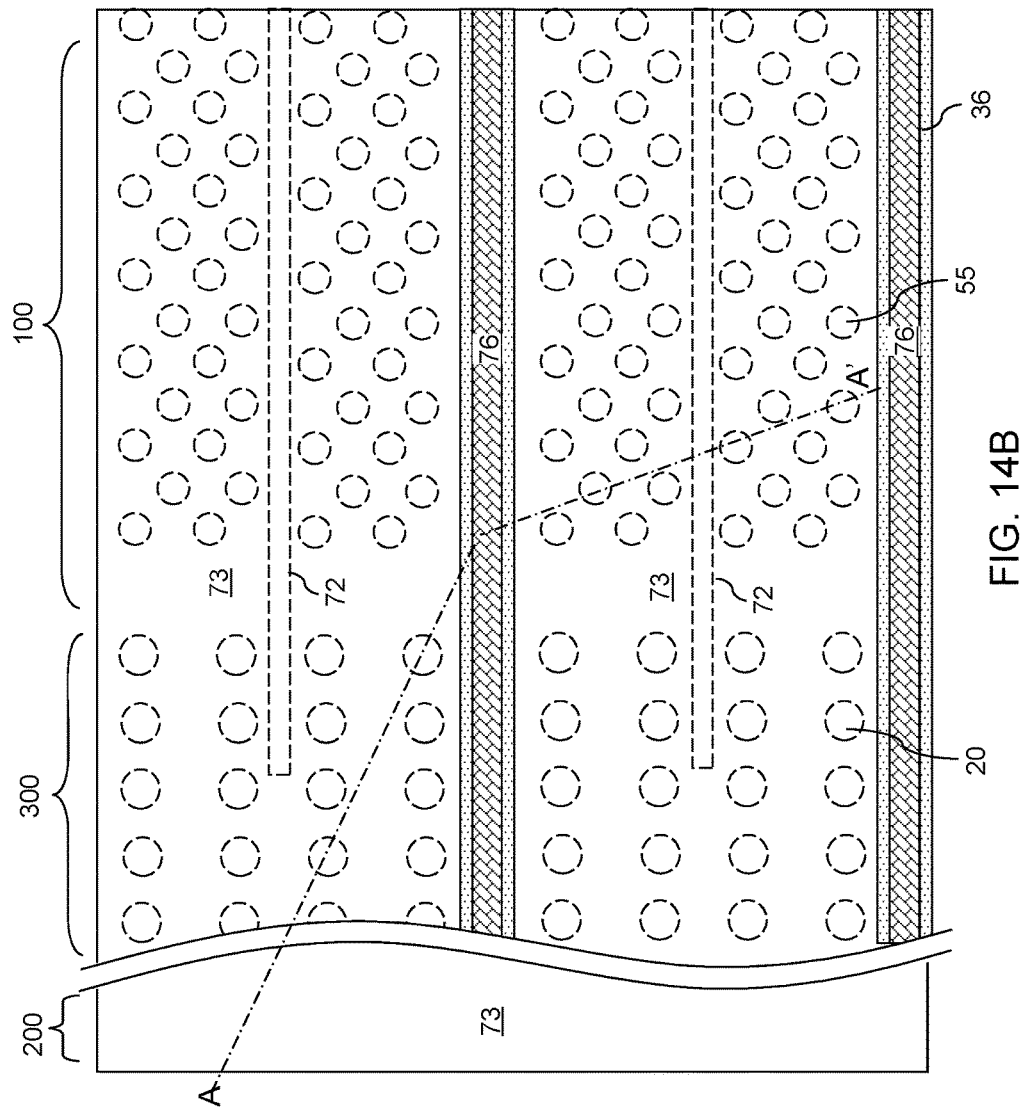
FIG. 14B is a magnified view of a region of the exemplary structure of FIG. 14A.

Referring to FIGS. 14A and 14B, a backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (38, 42', 44) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (38, 42', 44), and contacts a top surface of the substrate metal silicide layer 144. Each surface portion of the semiconductor material layer 10 that underlies the substrate metal silicide layer 144 constitutes a horizontal semiconductor channel 59, which is adjoined to the vertical semiconductor channels 60 of a set of memory stack structures 55 located between a neighboring pair of backside trenches 79. The substrate metal silicide layer 144 can function as a source region for the horizontal semiconductor channel 59. Alternatively, a doped source region can be formed in the semiconductor material layer 10 by implanting ions into the semiconductor material layer 10 through the backside trench 79 at the step shown in FIG. 9. In this case, the substrate metal silicide layer 144 can function as a source contact layer or it can be selectively removed over the source region.

Figure 15A:
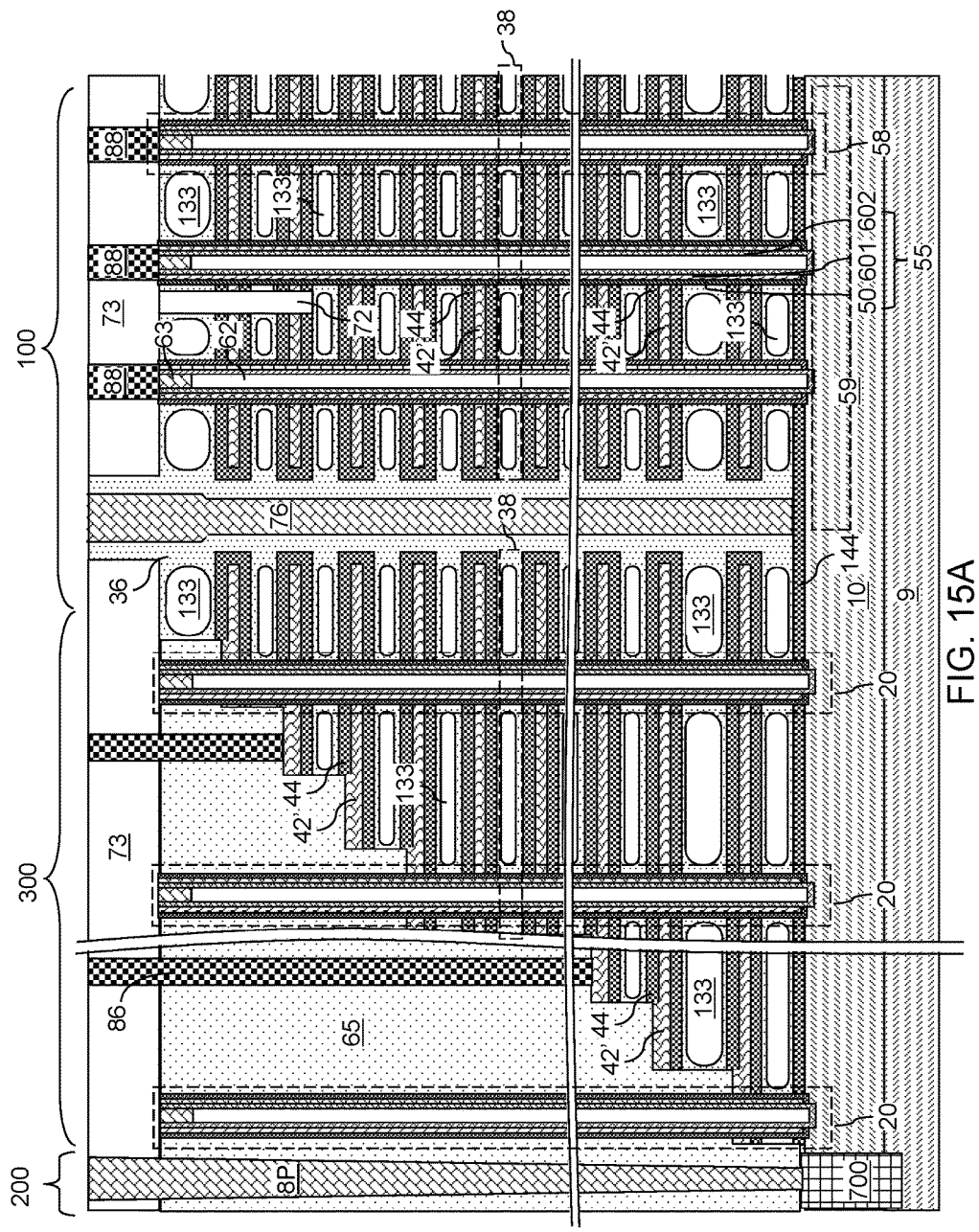
FIG. 15A is a schematic vertical cross-sectional view of the exemplary structure after formation of additional contact via structures according to an embodiment of the present disclosure.
Figure 15B:
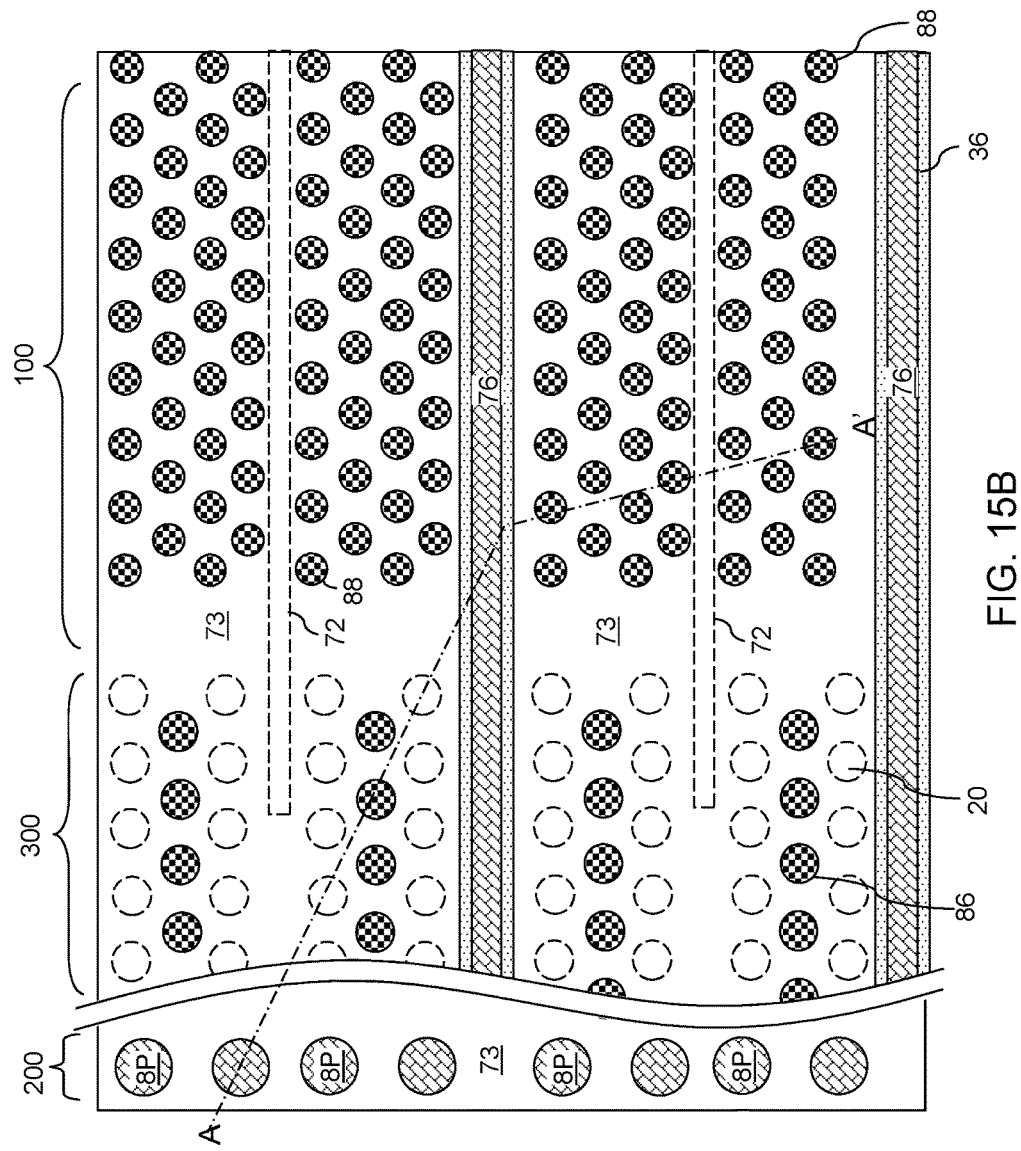
FIG. 15B is a top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the composite electrically conductive layers (42', 44) through the contact level dielectric layer 73, and through the retro-stepped dielectric material portion 65. In one embodiment, each word line contact via structure 86 through the retro-stepped dielectric material portion 65 may contact a respective one of the silicon-containing semiconductor core layers 42' and does not physically contact the metal silicide shell layers 44. Peripheral device contact via structures 8P can be formed through the retro-stepped dielectric material portion 65 directly on respective nodes of the peripheral devices.

Referring to all drawings of the present application, the various embodiments of the present disclosure provides a three-dimensional memory device. The three-dimensional memory device includes an alternating stack (38, 42', 44) of cavity-containing layers 38 and composite electrically conductive layers (42', 44) located over a substrate (9, 10), wherein each of the composite electrically conductive layers (42', 44) comprises a silicon-containing semiconductor core layer 42' and a metal silicide shell layer 44 contacting a top surface, a bottom surface, and a sidewall of the silicon-containing semiconductor core layer 42'; memory stack structures 55 extending through the alternating stack (38, 42', 44), wherein each of the memory stack structures 55 comprises a memory film 50 and a vertical semiconductor channel 60 contacting an inner sidewall of the memory film 50; and contact via structures 86 contacting a top surface of a respective one of the composite electrically conductive layers (42', 44).

In one embodiment, each memory film 50 comprises a tunneling dielectric layer 56 extending at least from a topmost one of the composite electrically conductive layers (42', 44) to a bottommost one of the composite electrically conductive layers (42', 44) as a continuous material layer, and a plurality of discrete charge storage material portions 54 located at each level of the composite electrically conductive layers (42', 44) and not present at levels of the cavity-containing layers 38. In one embodiment, a dielectric material of each of the cavity-containing layers 38 contacts an outer sidewall of each of the tunneling dielectric layers 56.

In one embodiment, the alternating stack (38, 42', 44) comprises a terrace region in which each composite electrically conductive layer (42', 44) other than a topmost composite electrically conductive layer (42', 44) within the alternating stack (38, 42', 44) laterally extends farther than an overlying composite electrically conductive layer (42', 44) within the alternating stack (38, 42', 44), and the terrace region includes stepped surfaces of the alternating stack (38, 42', 44) that continuously extend from a bottommost layer within the alternating stack (38, 42', 44) to a topmost layer within the alternating stack (38, 42', 44).

In one embodiment, a retro-stepped dielectric material portion 65 can overlie the alternating stack (38, 42', 44) in the terrace region. Top surfaces of the silicon-containing semiconductor core layers 42' and sidewalls of the metal silicide shell layers 44 can contact the retro-stepped dielectric material portion 65. In one embodiment, each of the silicon-containing semiconductor core layers 42' can have a greater thickness in a region that contacts the retro-stepped dielectric material portion 65 than outside the terrace region due to lack of thinning of the silicon-containing semiconductor layers 42 directly underneath the retro-stepped dielectric material portion 65 at the processing steps of FIG. 9.

In one embodiment, each of the cavity-containing layers 38 includes a respective laterally-extending cavity 133 that laterally surrounds the memory stack structures 55, and each of the cavity-containing layers 38 includes a respective dielectric material portion that extends as a dielectric liner and encapsulates the respective laterally-extending cavity 133. In one embodiment, backside trenches 79 can vertically extend from a topmost surface of the alternating stack (38, 42', 44) to the substrate (9, 10), wherein each dielectric liner of the cavity-containing layers 38 is adjoined to vertically-extending dielectric material portions 36 located inside a respective one of the backside trenches 79 and comprising a same dielectric material as the dielectric liners of the cavity-containing layers 38. In one embodiment, each of the silicon-containing semiconductor core layers 42' is laterally spaced from a most proximate one of the vertically-extending dielectric material portions 36 by a vertical portion of a respective one of the metal silicide shell layers 44.

In one embodiment, the retro-stepped dielectric material portion 65 can overlie the alternating stack (38, 42', 44) in the terrace region, and each dielectric liner of the cavity-containing layers 38 can contact sidewalls of the retro-stepped dielectric material portion 65. Support pillar structures 20 can vertically extend through the alternating stack (38, 42', 44) and the retro-stepped dielectric material portion 65, and can contact the substrate (9, 10). Each dielectric liner of the cavity-containing layers 38 can contact, and can laterally surround, the support pillar structures 20.

In one embodiment, a drain-select-level isolation structure 72 can laterally divide at least a topmost composite electrically conductive layer (42', 44) among the composite electrically conductive layers (42', 44). The drain-select-level isolation structure 72 can contact a sidewall of a topmost silicon-containing semiconductor core layer 42', a sidewall of an upper portion of a topmost metal silicide shell layer 44 that overlies the topmost silicon-containing semiconductor core layer 42', a sidewall of a lower portion of the topmost metal silicide shell layer 44 that underlies the topmost silicon-containing semiconductor core layer 42', and a sidewall of a dielectric liner of a topmost cavity-containing layer 38.

In one embodiment, a substrate metal silicide layer 144 can contact a top surface of a semiconductor material layer 10 in the substrate (9, 10). The substrate metal silicide layer 144 can include the same metal as the metal within the metal silicide shell layers 44, and can contact sidewalls of memory films 50 of the memory stack structures 55. In one embodiment, backside trenches 79 can vertically extend from a topmost surface of the alternating stack (38, 42', 44) to the substrate (9, 10), and backside contact via structures 76 can be located within a respective one of the backside trenches 79 and can contact the substrate metal silicide layer 144.

In one embodiment, the three-dimensional memory device comprises a monolithic three-dimensional NAND memory device, the composite electrically conductive layers (42', 44) comprise, or are electrically connected to, a respective word line of the monolithic three-dimensional NAND memory device, the substrate (9, 10) comprises a silicon substrate, and the monolithic three-dimensional NAND memory device comprises an array of monolithic three-dimensional NAND strings located over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The composite electrically conductive layers (42', 44) can comprise a plurality of control gate electrodes having a strip shape extending substantially parallel to the top surface of the substrate (9, 10). The plurality of control gate electrodes can comprise at least a first control gate electrode located in the first device level and a second control gate electrode located in the second device level. The array of monolithic three-dimensional NAND strings comprises a plurality of semiconductor channels (59, 60). At least one end portion of each of the plurality of semiconductor channels (59, 60) extends substantially perpendicular to a top surface of the substrate (9, 10). The array of monolithic three-dimensional NAND strings comprises a plurality of charge storage elements as embodied as discrete charge storage material portion 54. Each charge storage element is located adjacent to a respective one of the plurality of semiconductor channels (59, 60).

The exemplary structure provides a combination of silicided word lines, air gap layers, and discrete charge storage elements. The silicided word lines comprise composite electrically conductive layers (42', 44) that include a respective silicon-containing semiconductor core layer 42' and a respective metal silicide shell layer 44. The metal silicide shell layer 44 provides a low resistive conductive path for the word lines for the memory stack structures 55. The air gap layers comprise the cavity-containing layers 38 which include the air gap cavities 133, which provide a low effective dielectric constant and reduced capacitive coupling between neighboring pairs of the composite electrically conducive layers (42', 44). The discrete charge storage elements comprise the discrete charge storage portions 54 that are vertically spaced among one another within each memory stack structure 55. Vertical diffusion among charge storage elements is significantly reduced by eliminating charge leakage paths between vertically neighboring charge storage elements, thereby increasing charge retention in the charge storage elements.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of cavity-containing layers and composite electrically conductive layers located over a substrate, wherein each of the composite electrically conductive layers comprises a silicon-containing semiconductor core layer and a metal silicide shell layer contacting a top surface, a bottom surface, and a sidewall of the silicon-containing semiconductor core layer;
   memory stack structures extending through the alternating stack, wherein each of the memory stack structures comprises a memory film and a vertical semiconductor channel contacting an inner sidewall of the memory film; and
   contact via structures contacting a top surface of a respective one of the composite electrically conductive layers.

2. The three-dimensional memory device of claim 1, wherein each memory film comprises:
   a tunneling dielectric layer extending at least from a topmost one of the composite electrically conductive layers to a bottommost one of the composite electrically conductive layers as a continuous material layer; and
   a plurality of discrete charge storage material portions located at each level of the composite electrically conductive layers and not present at levels of the cavity-containing layers.

3. The three-dimensional memory device of claim 2, wherein:
   the alternating stack comprises a terrace region in which each composite electrically conductive layer other than a topmost composite electrically conductive layer within the alternating stack laterally extends farther than an overlying composite electrically conductive layer within the alternating stack;
   the terrace region includes stepped surfaces of the alternating stack that continuously extend from a bottommost layer within the alternating stack to a topmost layer within the alternating stack; and
   further comprising a retro-stepped dielectric material portion overlying the alternating stack in the terrace region, wherein top surfaces of the silicon-containing semiconductor core layers and sidewalls of the metal silicide shell layers contact the retro-stepped dielectric material portion.

4. The three-dimensional memory device of claim 3, wherein each of the silicon-containing semiconductor core layers has a greater thickness in a region that contacts the retro-stepped dielectric material portion than outside the terrace region.

5. The three-dimensional memory device of claim 3, wherein:
   each of the cavity-containing layers includes a respective laterally-extending cavity that laterally surrounds the memory stack structures;
   the laterally-extending cavity comprises an air gap;
   each of the cavity-containing layers includes a respective dielectric material portion that extends as a dielectric liner and encapsulates the respective laterally-extending cavity; and contacts an outer sidewall of the tunneling dielectric layer.

6. The three-dimensional memory device of claim 5, further comprising backside trenches that vertically extend from a topmost surface of the alternating stack to the substrate, and backside contact via structures located within the respective backside trenches, wherein each dielectric liner of the cavity-containing layers is adjoined to vertically-extending dielectric material portions located inside a respective one of the backside trenches and comprising a same dielectric material as the dielectric liners of the cavity-containing layers.

7. The three-dimensional memory device of claim 6, wherein:

each of the silicon-containing semiconductor core layers is laterally spaced from a most proximate one of the vertically-extending dielectric material portions by a vertical portion of a respective one of the metal silicide shell layers;

the metal silicide shell layer contacts the sidewall of the silicon-containing semiconductor core layer which faces the backside trench but does not contact an opposite sidewall of the silicon-containing semiconductor core layer which faces the memory film;

each dielectric liner of the cavity-containing layers contacts sidewalls of the retro-stepped dielectric material portion.

8. The three-dimensional memory device of claim 7, further comprising support pillar structures vertically extending through the alternating stack and the retro-stepped dielectric material portion and contacting the substrate, wherein each dielectric liner of the cavity-containing layers contacts, and laterally surrounds, the support pillar structures.

9. The three-dimensional memory device of claim 1, further comprising a drain-select-level isolation structure laterally dividing at least a topmost composite electrically conductive layer among the composite electrically conductive layers, wherein the drain-select-level isolation structure contacts a sidewall of a topmost silicon-containing semiconductor core layer, a sidewall of an upper portion of a topmost metal silicide shell layer that overlies the topmost silicon-containing semiconductor core layer, a sidewall of a lower portion of the topmost metal silicide shell layer that underlies the topmost silicon-containing semiconductor core layer, and a sidewall of a dielectric liner of a topmost cavity-containing layer.

10. The three-dimensional memory device of claim 1, wherein:

the three-dimensional memory device comprises a monolithic three-dimensional NAND memory device;

the composite electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the composite electrically conductive layers comprise a plurality of control gate electrodes having a strip shape extending substantially parallel to the top surface of the substrate;

the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *